US009875823B2

(12) United States Patent
Sasaki

(10) Patent No.: US 9,875,823 B2
(45) Date of Patent: Jan. 23, 2018

(54) FLAT CABLE

(71) Applicant: Murata Manufacturing Co., Ltd., Nagaokakyo-shi, Kyoto-fu (JP)

(72) Inventor: Satoshi Sasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 293 days.

(21) Appl. No.: 14/494,994

(22) Filed: Sep. 24, 2014

(65) Prior Publication Data

US 2015/0008012 A1    Jan. 8, 2015

Related U.S. Application Data

(63) Continuation of application No. PCT/JP2013/070721, filed on Jul. 31, 2013.

(30) Foreign Application Priority Data

Aug. 3, 2012 (JP) ................. 2012-172909

(51) Int. Cl.
*H05K 1/00* (2006.01)
*H01B 7/08* (2006.01)
(Continued)

(52) U.S. Cl.
CPC ........... *H01B 7/0823* (2013.01); *H01B 3/306* (2013.01); *H01P 3/085* (2013.01); *H05K 1/028* (2013.01);
(Continued)

(58) Field of Classification Search
CPC .... H01B 3/306; H01B 7/0823; H01B 7/0846; H01P 1/20363; H01P 3/003; H01P 3/08;
(Continued)

(56) References Cited

U.S. PATENT DOCUMENTS 3,818,122 A * 6/1974 Luetzow .................. H01B 7/04
                                             174/117 FF
4,658,090 A * 4/1987 Coon ...................... H01B 7/08
                                             174/117 FF
(Continued)

FOREIGN PATENT DOCUMENTS

JP    2009-009855 A    1/2009
JP    2009-054876 A    3/2009
(Continued)

OTHER PUBLICATIONS

PK232MBX__Assembly__Manual—pp. 1-4__Jan. 1993.*
(Continued)

*Primary Examiner* — Timothy Thompson
*Assistant Examiner* — Guillermo Egoavil
(74) *Attorney, Agent, or Firm* — Keating & Bennett, LLP

(57) ABSTRACT

A flat cable includes a dielectric element assembly including a plurality of dielectric layers laminated on each other in a direction of lamination, and a linear signal line provided in the dielectric element assembly. The dielectric element assembly includes at least one section bent in a plurality of places defining a zigzag shape when viewed in a plan view in the direction of lamination. In the zigzag section of the dielectric element assembly, any portions of the dielectric element assembly that are not adjacent across a bending line do not overlap when viewed in a plan view in the direction of lamination.

20 Claims, 17 Drawing Sheets

(51) Int. Cl.
*H01P 3/08* (2006.01)
*H01B 3/30* (2006.01)
*H05K 1/02* (2006.01)

(52) U.S. Cl.
CPC ......... *H05K 1/0253* (2013.01); *H05K 1/0221* (2013.01); *H05K 1/0225* (2013.01); *H05K 2201/055* (2013.01); *H05K 2201/0969* (2013.01); *H05K 2201/09618* (2013.01)

(58) Field of Classification Search
CPC .. H01P 3/10; H01P 3/026; H01P 3/085; H01P 3/121; H01L 2224/16225; H01L 2924/19105; H01R 12/61; H03H 7/38; H04B 15/00; H05K 1/025; H05K 1/028; H05K 1/113; H05K 1/118; H05K 1/147; H05K 1/148; H05K 1/0219; H05K 1/0221; H05K 1/0225; H05K 1/0242; H05K 1/0253; H05K 1/0393; H05K 2201/005; H05K 2201/09618; H05K 2201/0969; H05K 2201/09727; H05K 1/142; H05K 3/0032; H05K 3/4602; H05K 3/4652; H05K 3/4691; H05K 2201/096; H05K 2201/0715; H05K 2201/0909; H05K 2201/09127; H05K 2201/09263; H05K 2201/09509
USPC .................. 29/830; 174/117 F, 117 FF, 254; 333/33; 361/827
See application file for complete search history.

(56) References Cited

U.S. PATENT DOCUMENTS

| | | | | |
|---|---|---|---|---|
| 4,845,315 A | * | 7/1989 | Stopper | ................ H01B 7/0846 174/117 FF |
| 7,425,760 B1 | * | 9/2008 | Guenin | ................... H01L 24/72 257/698 |
| 2008/0047135 A1 | * | 2/2008 | Arnold | ................. H05K 3/4691 29/829 |
| 2008/0083559 A1 | * | 4/2008 | Kusamitsu | ............. H05K 3/281 174/254 |
| 2010/0075541 A1 | * | 3/2010 | Niitsu | ................... H01R 12/774 439/658 |
| 2010/0155109 A1 | * | 6/2010 | Takahashi | .............. H05K 1/028 174/254 |
| 2011/0247877 A1 | * | 10/2011 | Onodi | .................... H01B 7/295 174/70 R |
| 2012/0097433 A1 | | 4/2012 | Kato et al. | |
| 2012/0230170 A1 | * | 9/2012 | Hirata | .................... G11B 5/314 369/13.33 |
| 2012/0274423 A1 | | 11/2012 | Kato | |
| 2013/0146986 A1 | * | 6/2013 | Rashed | ........... H01L 21/823418 257/369 |
| 2013/0207740 A1 | * | 8/2013 | Kato | ....................... H01P 3/082 333/33 |

FOREIGN PATENT DOCUMENTS

| | | |
|---|---|---|
| JP | 2009-176395 A | 8/2009 |
| JP | 2010-212223 A | 9/2010 |
| WO | 2011/007660 A1 | 1/2011 |
| WO | 2012/073591 A1 | 6/2012 |
| WO | WO2012074100 A1 * | 6/2012 |
| WO | WO 2012074100 A1 * | 6/2012 ............... H05K 1/02 |

OTHER PUBLICATIONS

Official Communication issued in corresponding Japanese Patent Application No. 2014-528191, dated Sep. 24, 2014.
Official Communication issued in International Patent Application No. PCT/JP2013/070721, dated Oct. 8, 2013.

* cited by examiner

F I G. 1
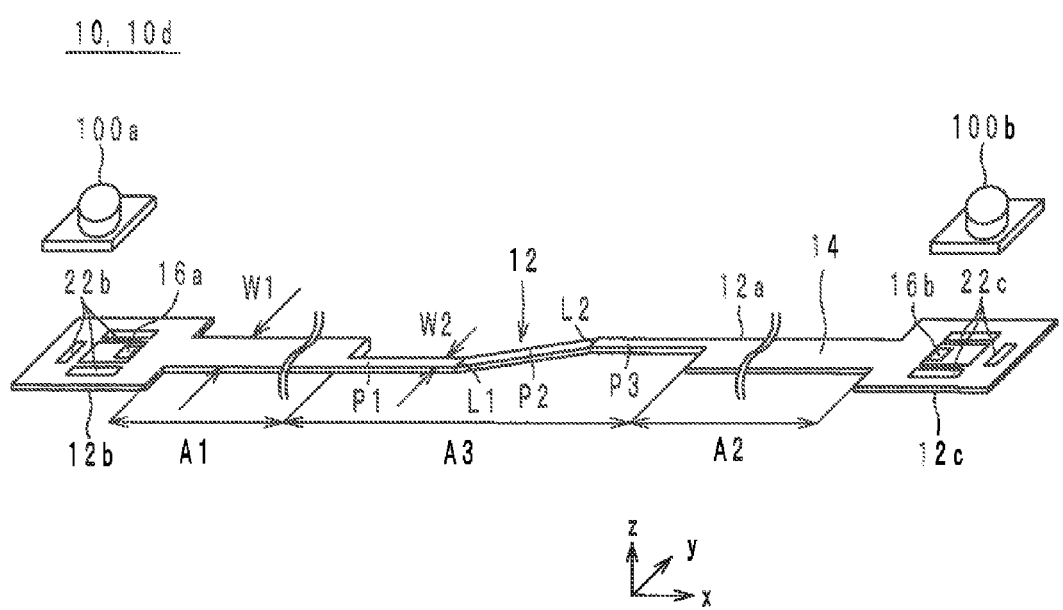

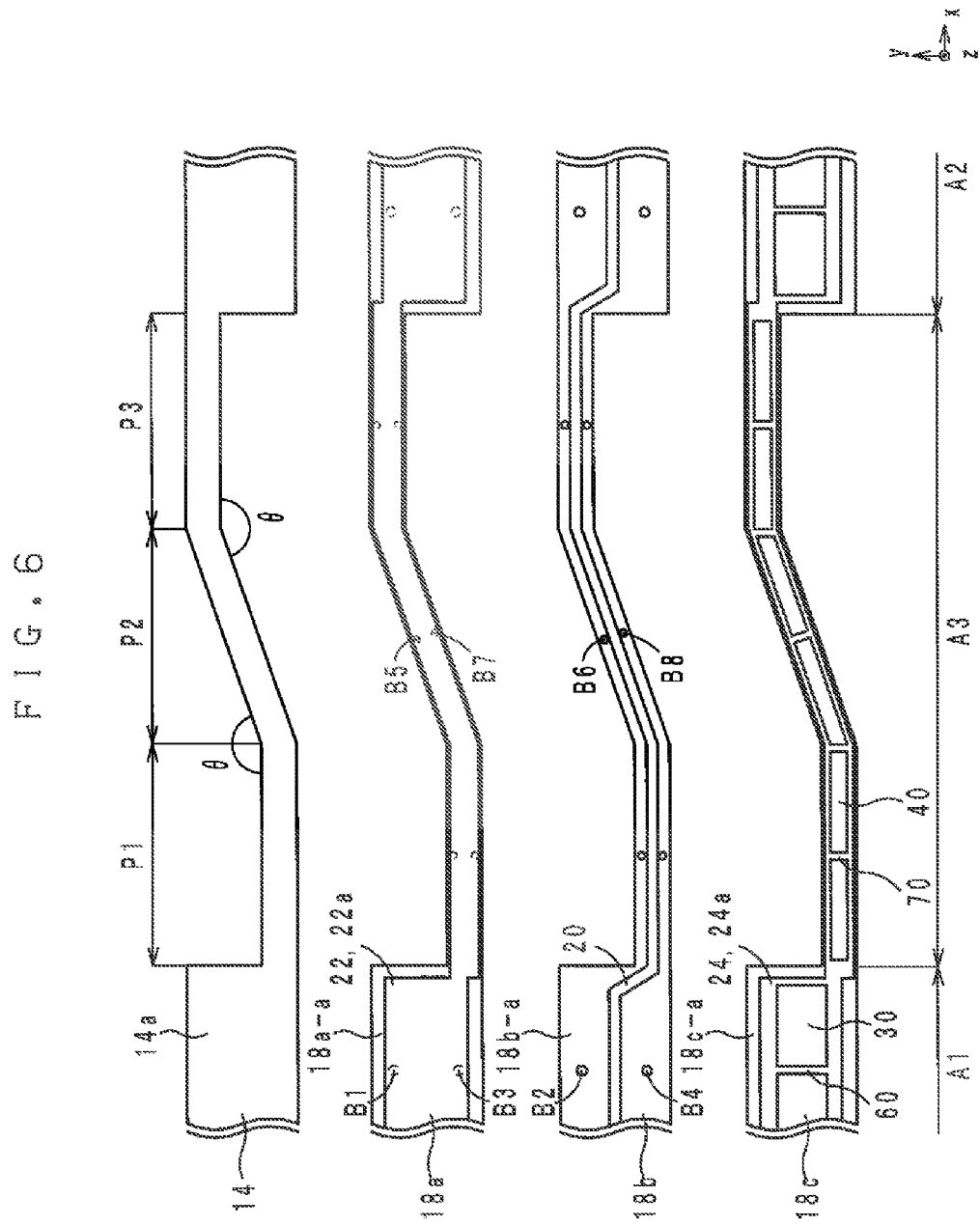

F I G. 7A
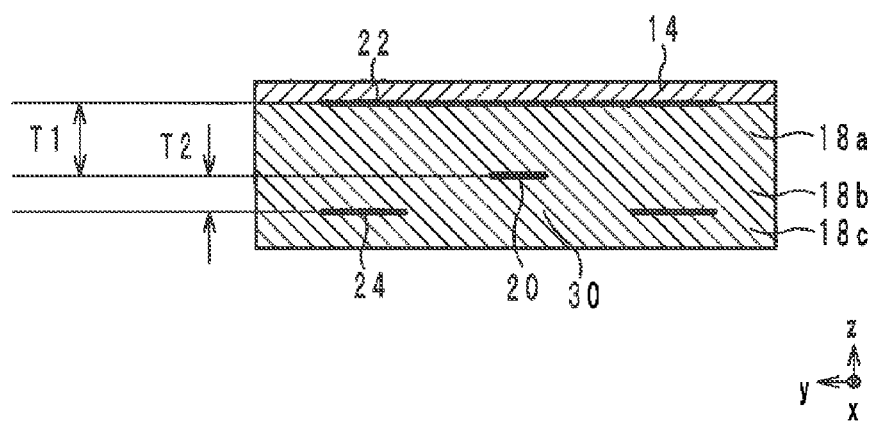
F I G. 7B
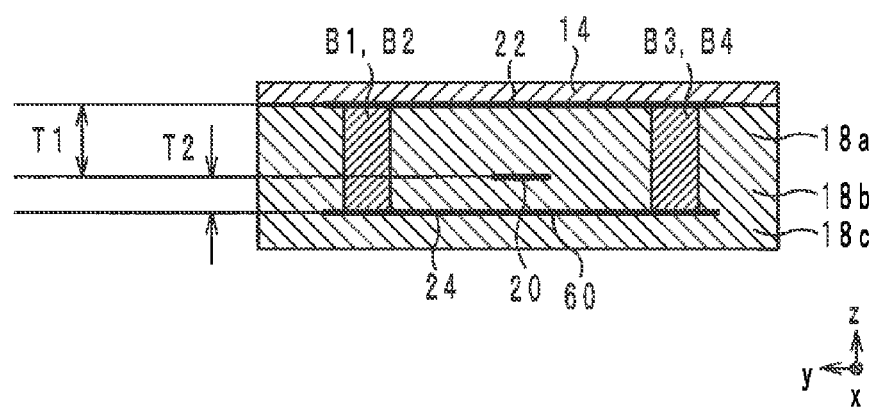

F I G. 8 A
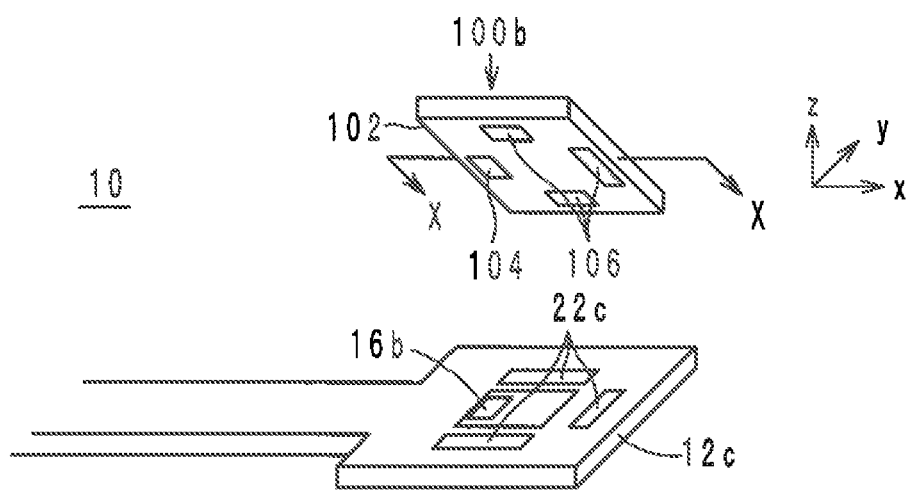
F I G. 8 B
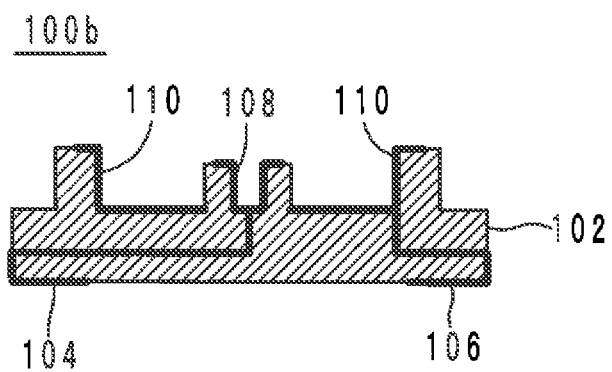

F I G. 9A
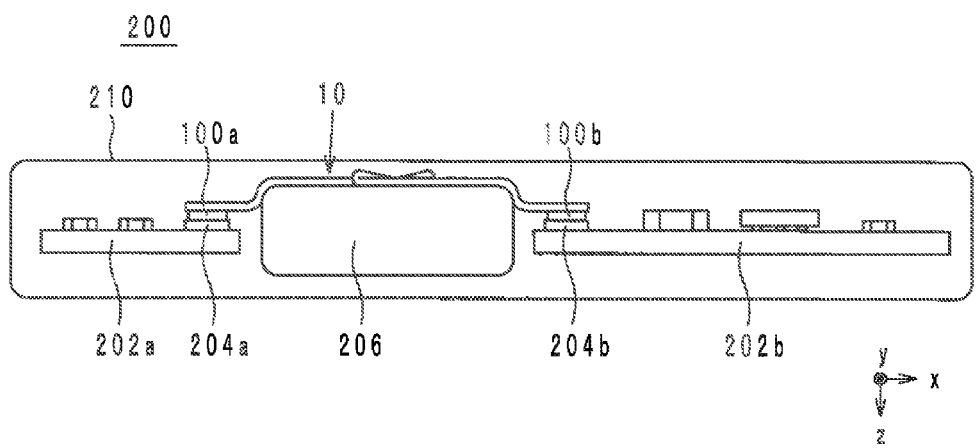
F I G. 9B
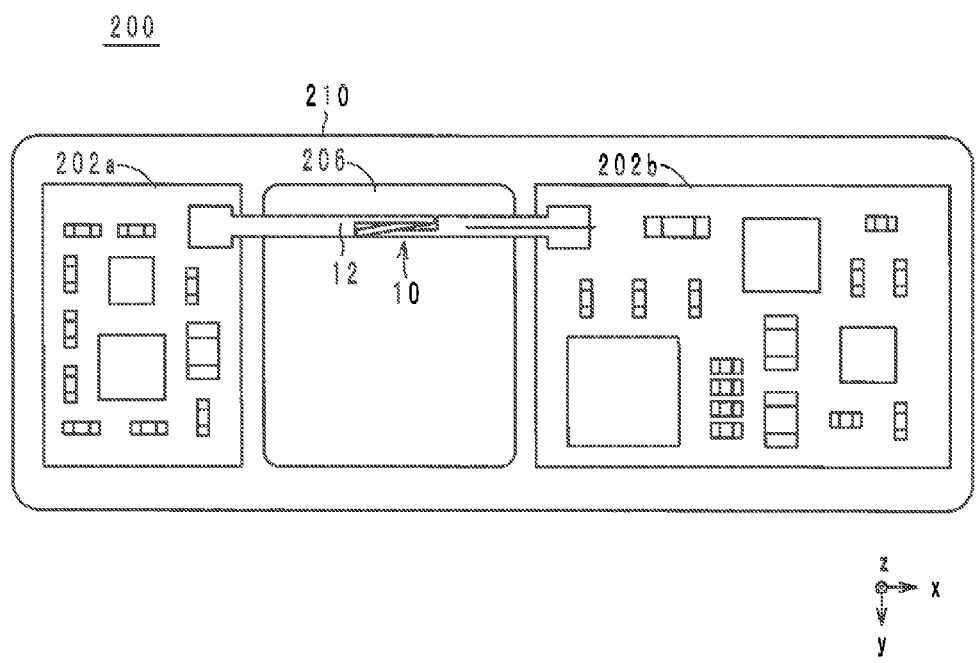

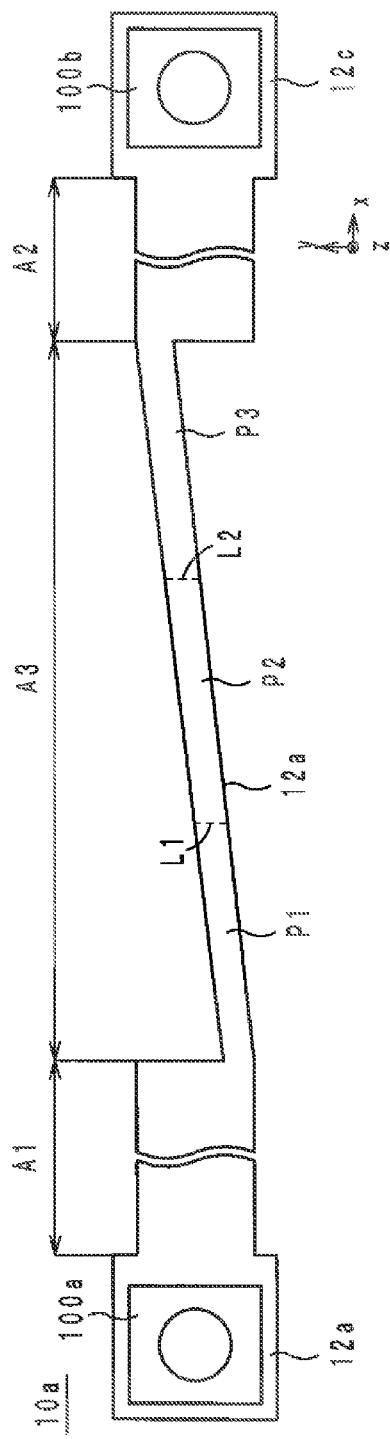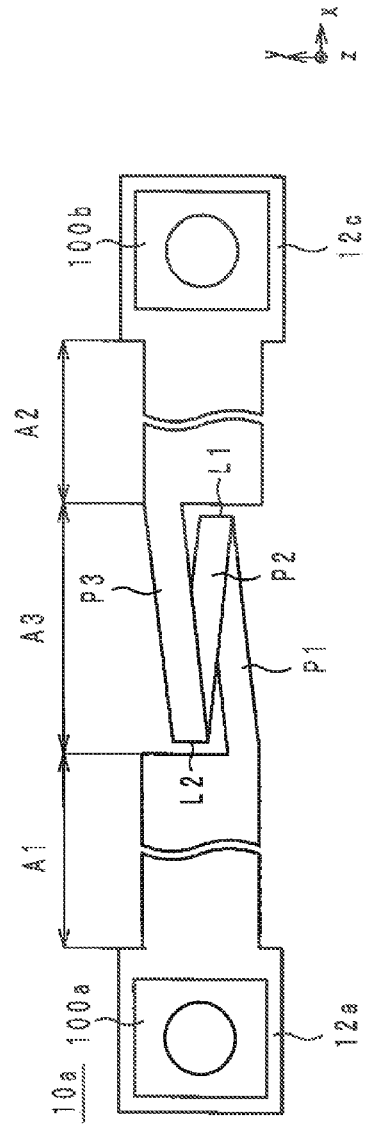

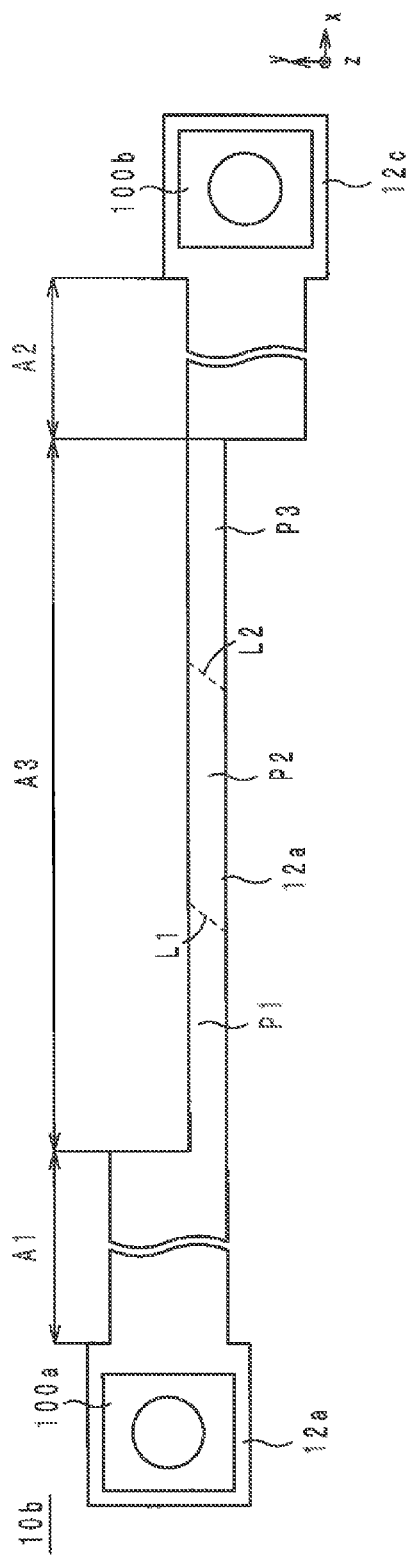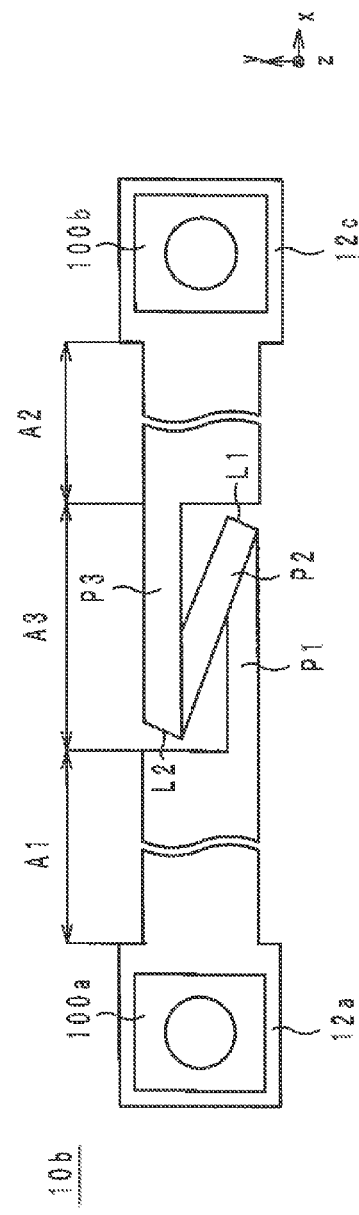

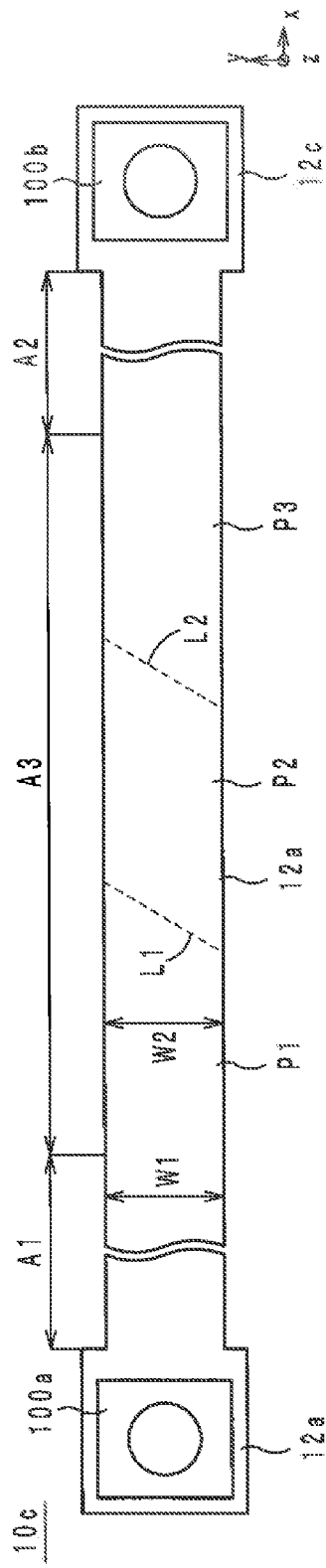
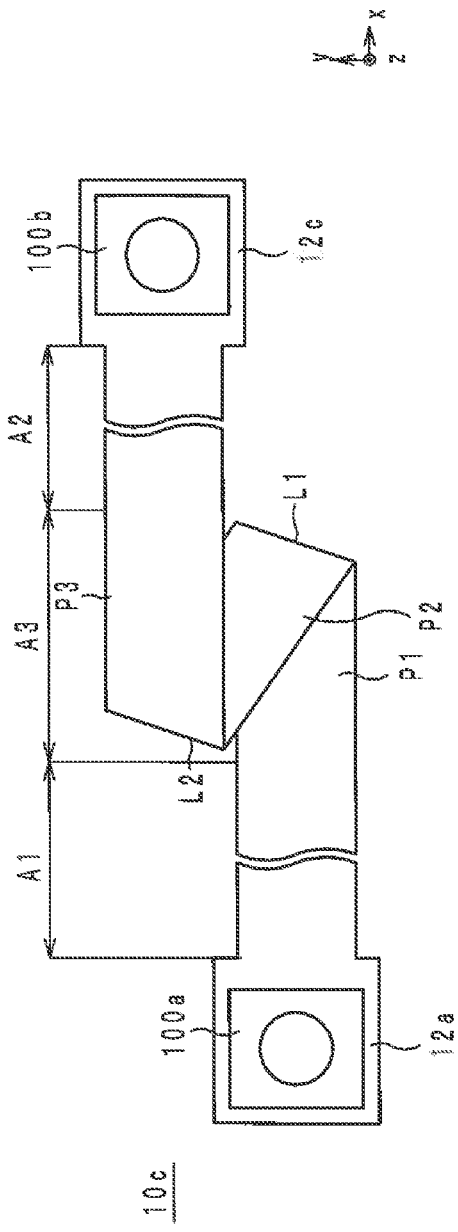
F I G. 12A
F I G. 12B

FLAT CABLE

This application is based on Japanese Patent Application No. 2012-172909 filed on Aug. 3, 2012, and International Application No. PCT/JP2013/070721 filed on Jul. 31, 2013, and the entire contents of each of which are hereby incorporated herein by reference.

BACKGROUND OF THE INVENTION

1. Field of the Invention

The present invention relates to flat cables, more particularly to a flat cable preferably for use in high-frequency signal transmission.

2. Description of the Related Art

As an invention relevant to a conventional flat cable, a high-frequency signal line described in, for example, International Publication WO 2012/073591 is known. The high-frequency signal line includes a dielectric element assembly, a signal line, and two ground conductors. The dielectric element assembly is formed by laminating a plurality of dielectric sheets. The signal line is provided in the dielectric element assembly. The two ground conductors are opposed to each other with respect to the signal line in the direction of lamination of the dielectric element assembly. Accordingly, the signal line and the two ground conductors form a stripline structure.

Furthermore, the ground conductors have a plurality of openings overlapping with the signal line when viewed in a plan view in the direction of lamination. As a result, less capacitance is created between the signal line and the ground conductors. Therefore, it is possible to shorten the distances between the signal line and the ground conductors in the direction of lamination, resulting in a thinner high-frequency signal line. Such a high-frequency signal line is used, for example, to connect two circuit boards.

Incidentally, the high-frequency signal line described in International Publication WO 2012/073591 might have defective connections between the circuit boards and the high-frequency signal line, as will be described below. FIG. 17A is a top view where the high-frequency signal line 500 described in International Publication WO 2012/073591 is bent in two places into a Z-like shape. FIG. 17B is a side view where the high-frequency signal line 500 described in International Publication WO 2012/073591 is bent in two places into a Z-like shape.

When the high-frequency signal line 500 is intended to connect two circuit boards, the length of the high-frequency signal line 500 is typically designed to be equal to the distance between external terminals (e.g., connectors or flat terminal electrodes) of the two circuit boards. However, in such a case, the high-frequency signal line 500 is stretched between the two circuit boards, generating a force to detach the high-frequency signal line 500 from the external terminals. That is, there might be defective connections between the circuit boards and the high-frequency signal line 500.

To solve such an issue, the length of the high-frequency signal line 500 is designed to be longer than the distance between the external terminals of the circuit boards. In addition, the high-frequency signal line 500 is bent in two places, as shown in FIGS. 17A and 17B. As a result, the length of the high-frequency signal line 500 can be adjusted properly so as not to generate a force to detach the high-frequency signal line 500 from the external terminals.

However, when the high-frequency signal line 500 is bent in two places, the high-frequency signal line 500 overlaps in three layers, as shown in FIG. 17B. Therefore, even if the high-frequency signal line 500 is reduced in thickness, it is thick at the overlapping portions of the three layers.

SUMMARY OF THE INVENTION

A flat cable according to a preferred embodiment of the present invention includes a dielectric element assembly including a plurality of dielectric layers, and a linear signal line provided in the dielectric element assembly. The dielectric element assembly includes at least one section bent in a plurality of places thus defining a zigzag section when viewed in a plan view in a direction of lamination. In the zigzag section of the dielectric element assembly, any portions of the dielectric element assembly that are not adjacent across a bending line do not overlap when viewed in a plan view in the direction of lamination.

A flat cable according to another preferred embodiment of the present invention includes a dielectric element assembly including a plurality of dielectric layers, and a linear signal line provided in the dielectric element assembly. The dielectric element assembly includes a first section having a first width, a second section having the first width, and a third section having a second width smaller than the first width and being positioned between the first section and the second section. The third section includes a first portion, a second portion, and a third portion, the second portion being positioned between the first portion and the third portion and defining obtuse angles with the first portion and the third portion, the third portion being parallel or substantially parallel to the first portion.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is an external oblique view of a flat cable according to a first preferred embodiment of the present invention.

FIG. 6 is still another exploded view of the flat cable in FIG. 1.

FIG. 7A is a cross-sectional structure view taken along line A-A of FIG. 4.

FIG. 7B is a cross-sectional structure view taken along line B-B of FIG. 4.

FIG. 8A is an oblique external view of a connector of the flat cable.

FIG. 8B is a cross-sectional structure view of the connector of the flat cable.

FIG. 9A illustrates an electronic device provided with the flat cable as viewed in a plan view in the y-axis direction.

FIG. 9B illustrates the electronic device provided with the flat cable as viewed in a plan view in the z-axis direction.

FIG. 10A is a top view of a flat cable according to a first modification of the first preferred embodiment of the present invention.

FIG. 10B is a top view where the flat cable in FIG. 10A is bent.

FIG. 11A is a top view of a flat cable according to a second modification of the first preferred embodiment of the present invention.

FIG. 11B is a top view where the flat cable in FIG. 11A is bent.

FIG. 12A is a top view of a flat cable according to a third modification of the first preferred embodiment of the present invention.

FIG. 12B is a top view where the flat cable in FIG. 12A is bent.

DETAILED DESCRIPTION OF THE PREFERRED EMBODIMENTS

Hereinafter, flat cables according to preferred embodiments of the present invention will be described with reference to the drawings.

First Preferred Embodiment

Figure 2:
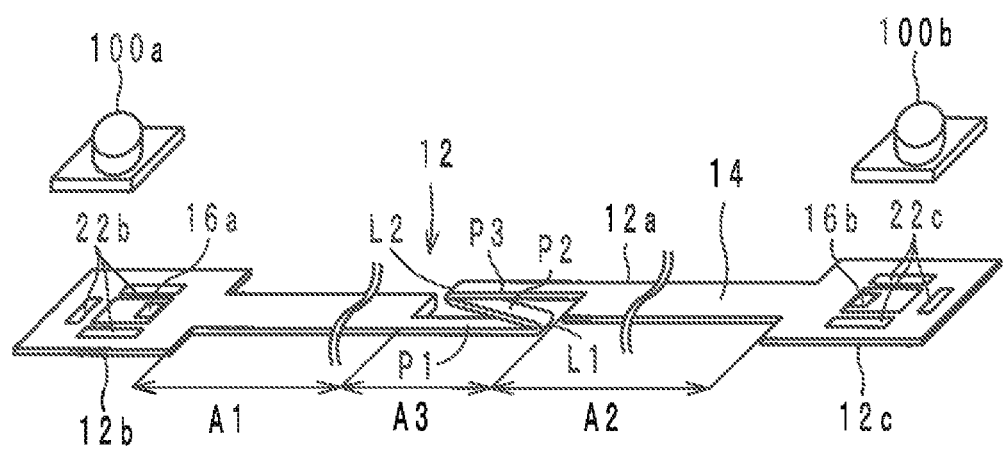
FIG. 2 is an external oblique view where the flat cable in FIG. 1 is bent.
Figure 3:
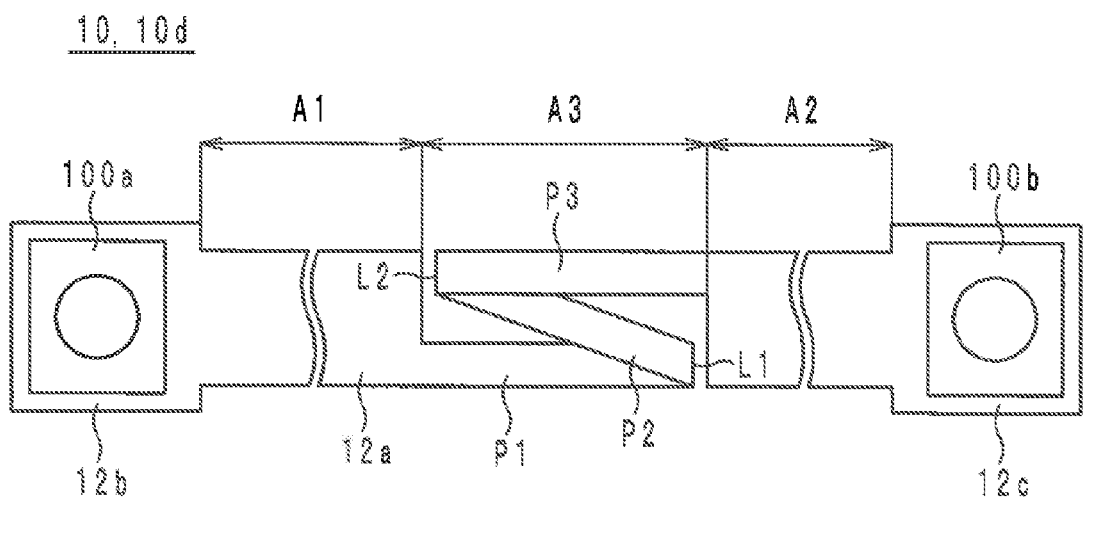
FIG. 3 is a top view of the flat cable in FIG. 2.
Figure 4:
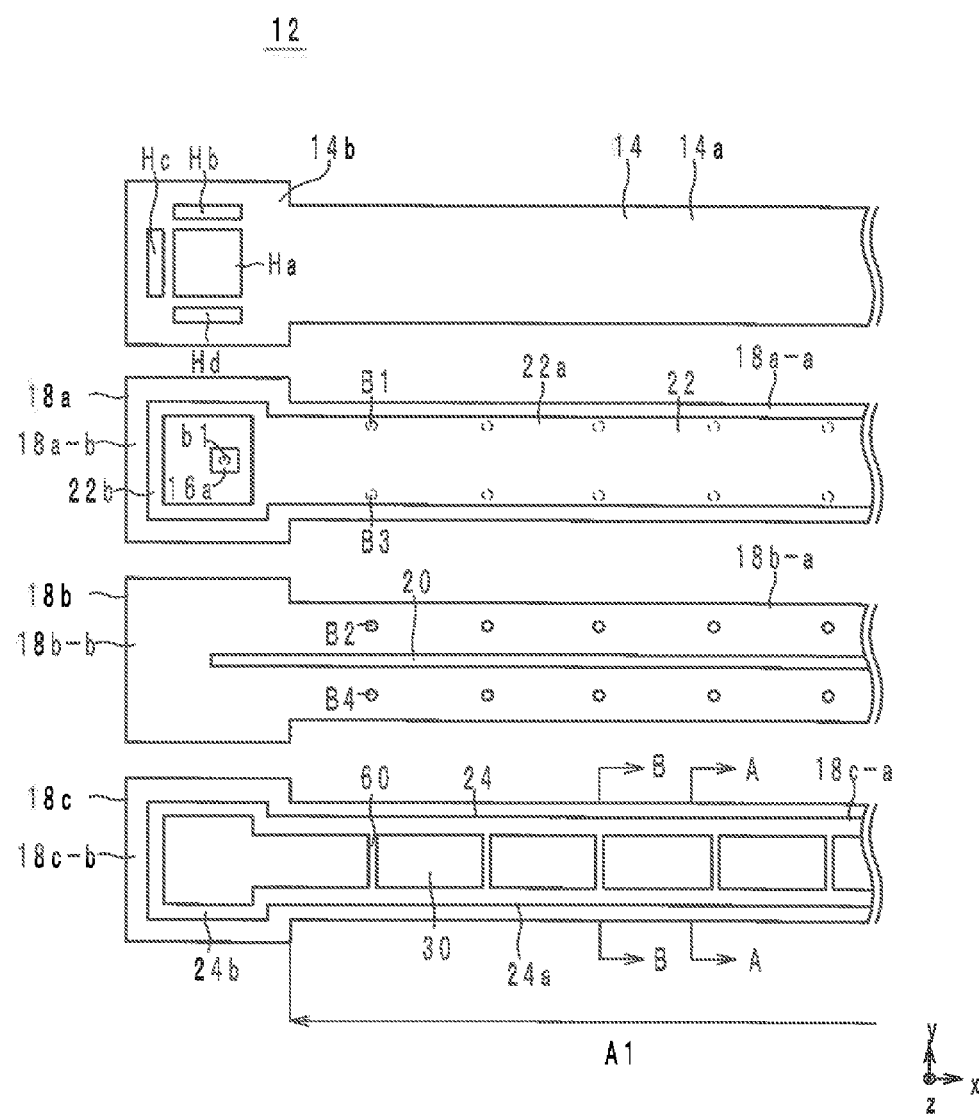
FIG. 4 is an exploded view of the flat cable in FIG. 1.
Figure 5:
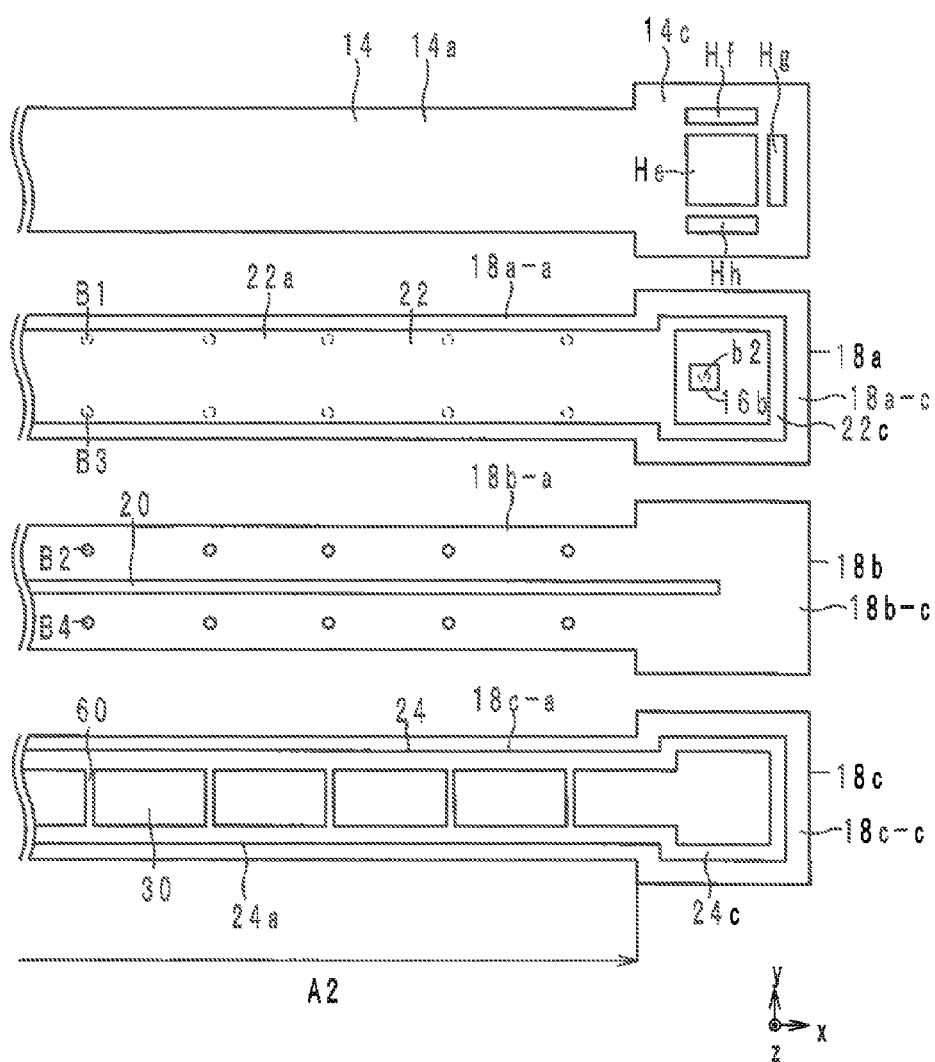
FIG. 5 is another exploded view of the flat cable in FIG. 1.

The configuration of a flat cable according to a first preferred embodiment of the present invention will be described below with reference to the drawings. FIG. 1 is an external oblique view of the flat cable 10 according to the first preferred embodiment. FIG. 2 is an external oblique view where the flat cable 10 in FIG. 1 is bent. FIG. 3 is a top view of the flat cable 10 in FIG. 2. FIGS. 4 through 6 are exploded views of the flat cable 10 in FIG. 1. FIG. 7A is a cross-sectional structure view taken along line A-A of FIG. 4. FIG. 7B is a cross-sectional structure view taken along line B-B of FIG. 4. In the following, the direction of lamination of the flat cable 10 will be defined as a z-axis direction. Moreover, the longitudinal direction of the flat cable 10 will be defined as an x-axis direction, and the direction perpendicular to the x-axis and z-axis directions will be defined as a y-axis direction.

The flat cable 10 is preferably used in, for example, an electronic device such as a cell phone to connect two high-frequency circuits. The flat cable 10 includes a dielectric element assembly 12, external terminals 16a and 16b, a signal line 20, a reference ground conductor (second ground conductor) 22, an auxiliary ground conductor (first ground conductor) 24, via-hole conductors (inter-layer connecting portions) b1, b2, and B1 to B8, and connectors 100a and 100b, as shown in FIGS. 1 through 6.

The dielectric element assembly 12 is a flexible plate-shaped member extending in the x-axis direction when viewed in a plan view in the z-axis direction, and includes a line portion 12a and connecting portions 12b and 12c, as shown in FIG. 1. The dielectric element assembly 12 is a laminate formed by laminating a protective layer 14 and dielectric sheets 18a to 18c in this order from the positive side to the negative side in the z-axis direction, as shown in FIGS. 4 through 6. In the following, the principal surface of the dielectric element assembly 12 that is located on the positive side in the z-axis direction will be referred to as a top surface, and the principal surface of the dielectric element assembly 12 that is located on the negative side in the z-axis direction will be referred to as a bottom surface.

The line portion 12a extends in the x-axis direction and includes sections A1 to A3, as shown in FIG. 1. The sections A1 and A2 have a width W1 in the y-axis direction, and extend in the x-axis direction. The section A3 has a width W2 in the y-axis direction, and is positioned between the sections A1 and A2. The width W2 is less than the width W1. In addition, the section A3 extends in the x-axis direction, and includes portions P1 to P3.

The portion P1 extends toward the positive side in the x-axis direction from the corner of the section A1 where the negative side in the y-axis direction meets the positive side in the x-axis direction. The portion P3 extends toward the negative side in the x-axis direction from the corner of the section A2 where the positive side in the y-axis direction meets the negative side in the x-axis direction. That is, the portions P1 and P3 are parallel or substantially parallel. However, the portion P1 is located on the negative side in the y-axis direction relative to the portion P3, as shown in FIGS. 1 and 6.

The portion P2 is positioned between the portions P1 and P3, and extends toward the positive side in the x-axis direction. More specifically, the portion P2 is connected to both the end of the portion P1 on the positive side in the x-axis direction and the end of the portion P2 on the negative side in the x-axis direction. Since the portion P1 is located on the negative side in the y-axis direction relative to the portion P3, the portion P2 is oblique to the positive side in the y-axis direction toward the positive side in the x-axis direction, as shown in FIG. 6. Accordingly, the portion P3, when viewed in a plan view in the z-axis direction, defines obtuse angles θ with the portions P1 and P2, as shown in FIG. 6.

The connecting portions 12b and 12c preferably are in the shape of rectangles respectively connected to the ends of the line portion 12a on the negative and positive sides in the x-axis direction. The width of each of the connecting portions 12b and 12c in the y-axis direction is greater than the width W1 of the line portion 12a in the y-axis direction.

The dielectric sheets 18a to 18c, when viewed in a plan view in the z-axis direction, extend in the x-axis direction and preferably have the same planar shape as the dielectric element assembly 12, as shown in FIGS. 4 through 6. The dielectric sheets 18a to 18c are preferably made of a flexible thermoplastic resin such as polyimide or liquid crystal polymer. In the following, the principal surfaces of the dielectric sheets 18a to 18c that are located on the positive side in the z-axis direction will be referred to as top surfaces, and the principal surfaces of the dielectric sheets 18a to 18c that are located on the negative side in the z-axis direction will be referred to as bottom surfaces.

The thickness T1 of the dielectric sheet 18a is greater than the thickness T2 of the dielectric sheet 18b, as shown in FIGS. 7A and 7B. After lamination of the dielectric sheets 18a to 18c, the thickness T1 preferably is, for example, from about 50 μm to about 300 μm, for example. In the present preferred embodiment, the thickness T1 preferably is about 100 μm, for example. Moreover, the thickness T2 preferably is, for example, from about 10 μm to about 100 μm, for example. In the present preferred embodiment, the thickness T2 preferably is about 50 μm, for example.

Furthermore, the dielectric sheet 18a includes a line portion 18a-a and connecting portions 18a-b and 18a-c, as shown in FIGS. 4 through 6. The dielectric sheet 18b includes a line portion 18b-a and connecting portions 18b-b and 18b-c. The dielectric sheet 18c includes a line portion 18c-a and connecting portions 18c-b and 18c-c. The line portions 18a-a, 18b-a, and 18c-a constitute the line portion 12a. The connecting portions 18a-b, 18b-b, and 18c-b constitute the connecting portion 12b. The connecting portions 18a-c, 18b-c, and 18c-c constitute the connecting portion 12c.

The signal line 20 is a linear conductor provided in the dielectric element assembly 12 for the purpose of high-frequency signal transmission, as shown in FIGS. 4 through 6. In the present preferred embodiment, the signal line 20 is preferably provided on the top surface of the dielectric sheet 18b. The signal line 20 extends in the x-axis direction along the line portion 18b-a. The signal line 20 is positioned essentially at the center of the line portion 18b-a in the y-axis direction. The end of the signal line 20 that is located on the negative side in the x-axis direction is positioned essentially at the center of the connecting portion 18b-b, as shown in FIG. 4. The end of the signal line 20 that is located on the positive side in the x-axis direction is positioned at or substantially at the center of the connecting portion 18b-c, as shown in FIG. 5. The signal line 20 preferably has a width of, for example, from about 300 μm to about 700 μm. In the present preferred embodiment, the width of the signal line 20 preferably is about 300 μm, for example. The signal line 20 is preferably made of a metal material mainly composed of silver or copper and having a low specific resistance. Here, the signal line 20 is preferably provided on the top surface of the dielectric sheet 18b preferably by patterning metal foil formed by plating the top surface of the dielectric sheet 18b or by patterning metal foil attached to the top surface of the dielectric sheet 18b. Moreover, the top surface of the signal conductor 20 is smoothened, so that surface roughness of the signal conductor 20 is greater on the side that contacts the dielectric sheet 18b than on the side that does not contact the dielectric sheet 18b.

The reference ground conductor 22 is a solid conductor layer provided on the positive side in the z-axis direction relative to the signal line 20, as shown in FIGS. 4 through 6. More specifically, the reference ground conductor 22 is preferably provided on the top surface of the dielectric sheet 18a so as to be opposed to the signal line 20 with respect to the dielectric sheet 18a. The reference ground conductor 22 has no openings overlapping with the signal line 20. The reference ground conductor 22 preferably is made of a metal material mainly composed of silver or copper and having a low specific resistance. Here, the reference ground conductor 22 is preferably provided on the top surface of the dielectric sheet 18a preferably by patterning metal foil formed by plating the top surface of the dielectric sheet 18a or by patterning metal foil attached to the top surface of the dielectric sheet 18a. Moreover, the top surface of the reference ground conductor 22 is smoothened, so that surface roughness of the reference ground conductor 22 is greater on the side that contacts the dielectric sheet 18a than on the side that does not contact the dielectric sheet 18a.

Furthermore, the reference ground conductor 22 includes a line portion 22a and terminal portions 22b and 22c, as shown in FIGS. 4 through 6. The line portion 22a is provided on the top surface of the line portion 18a-a, and extends in the x-axis direction. The width of the line portion 22a in the y-axis direction is greater in the sections A1 and A2 than in the section A3. The terminal portion 22b is preferably has a rectangular or substantially rectangular frame shape on the top surface of the line portion 18a-b. The terminal portion 22b is connected to the end of the line portion 22a on the negative side in the x-axis direction. The terminal portion 22c preferably has a rectangular or substantially rectangular frame shape on the top surface of the line portion 18a-c. The terminal portion 22c is connected to the end of the line portion 22a on the positive side in the x-axis direction.

The auxiliary ground conductor 24 is provided on the negative side in the z-axis direction relative to the signal line 20, as shown in FIGS. 4 through 6. The auxiliary ground conductor 24 includes a plurality of openings 30 and 40 arranged along the signal line 20. More specifically, the auxiliary ground conductor 24 is preferably arranged on the top surface of the dielectric sheet 18c so as to be opposed to the signal line 20 with respect to the dielectric sheet 18b. The auxiliary ground conductor 24 is preferably made of a metal material mainly composed of silver or copper and having a low specific resistance. Here, the auxiliary ground conductor 24 is preferably provided on the top surface of the dielectric sheet 18c preferably by patterning metal foil formed by plating the top surface of the dielectric sheet 18c or by patterning metal foil attached to the top surface of the dielectric sheet 18c. Moreover, the top surface of the auxiliary ground conductor 24 is smoothened, so that surface roughness of the auxiliary ground conductor 24 is greater on the side that contacts the dielectric sheet 18c than on the side that does not contact the dielectric sheet 18c.

Furthermore, the auxiliary ground conductor 24 includes a line portion 24a and terminal portions 24b and 24c, as shown in FIGS. 4 through 6. The line portion 24a is provided on the top surface of the line portion 18c-a, and extends in the x-axis direction. The width of the line portion 24a in the y-axis direction is greater in the sections A1 and A2 than in the section A3. The terminal portion 24b preferably has a rectangular or substantially frame shape on the top surface of the line portion 18c-b. The terminal portion 24b is connected to the end of the line portion 24a on the negative side in the x-axis direction. The terminal portion 24c preferably has a rectangular or substantially rectangular frame shape on the top surface of the line portion 18c-c. The terminal portion 24c is connected to the end of the line portion 24a on the positive side in the x-axis direction.

Furthermore, the line portion 24a includes the openings 30 and 40 preferably provided in the form of rectangles and extending in the x-axis direction, as shown in FIGS. 4 through 6. More specifically, the openings 30 are provided in the line portion 24a in the sections A1 and A2. Moreover, portions of the line portion 24a that are positioned between the openings 30 in the sections A1 and A2 will be referred to as bridge portions 60. The bridge portions 60 are linear conductors extending in the y-axis direction. Accordingly, the line portion 24a preferably has a ladder-shaped configuration in the sections A1 and A2. The openings 30 and the bridge portions 60, when viewed in a plan view in the z-axis direction, alternatingly overlap with the signal line 20. In the present preferred embodiment, the signal line 20 extends in the x-axis direction so as to cross the centers of the openings 30 and the bridge portions 60 in the y-axis direction.

Furthermore, the openings 40 are provided in the line portion 24a in the section A3. The width of the opening 40 in the y-axis direction is less than the width of the opening 30 in the y-axis direction, as shown in FIG. 6. Moreover, portions of the line portion 24a that are positioned between the openings 40 in the section A3 will be referred to as bridge portions 70. The bridge portions 70 are linear conductors extending in the y-axis direction. Accordingly, the line portion 24a preferably has a ladder-shaped configuration in the section A3. The openings 40 and the bridge portions 70, when viewed in a plan view in the z-axis direction, alternatingly overlap with the signal line 20. In the present preferred embodiment, the signal line 20 extends in the x-axis direction so as to cross the centers of the openings 40 and the bridge portions 70 in the y-axis direction.

The external terminal 16a is a rectangular or substantially rectangular conductor provided at or substantially at the center on the top surface of the connecting portion 18a-b, as shown in FIGS. 1 and 4. Accordingly, the external terminal 16a, when viewed in a plan view in the z-axis direction, overlaps with the end of the signal line 20 that is located on the negative side in the x-axis direction. The external terminal 16b is a rectangular or substantially rectangular conductor provided at or substantially at the center on the top surface of the connecting portion 18a-c, as shown in FIGS. 1 and 4. Accordingly, the external terminal 16b, when viewed in a plan view in the z-axis direction, overlaps with the end of the signal line 20 that is located on the positive side in the x-axis direction. The external terminals 16a and 16b preferably are made of a metal material mainly composed of silver or copper and having a low specific resistance. Moreover, the top surfaces of the external terminals 16a and 16b preferably are plated with Ni and Au. Here, the external terminals 16a and 16b are provided on the top surface of the dielectric sheet 18a preferably by patterning metal foil formed by plating the top surface of the dielectric sheet 18a or by patterning metal foil attached to the top surface of the dielectric sheet 18a. Moreover, the top surfaces of the external terminals 16a and 16b are smoothened, so that surface roughness of the external terminals 16a and 16b is greater on the side that contacts the dielectric sheet 18a than on the side that does not contact the dielectric sheet 18a.

In this manner, the signal line 20 is positioned between the reference ground conductor 22 and the auxiliary ground conductor 24 in the z-axis direction. That is, the signal line 20, the reference ground conductor 22, and the auxiliary ground conductor 24 define a tri-plate stripline structure. Moreover, the gap between the signal line 20 and the reference ground conductor 22 (the distance therebetween in the z-axis direction) preferably is, for example, from about 50 μm to about 300 μm, which is equal or approximately equal to the thickness T1 of the dielectric sheet 18a, as shown in FIGS. 7A and 7B. In the present preferred embodiment, the gap between the signal line 20 and the reference ground conductor 22 preferably is about 100 μm, for example. On the other hand, the gap between the signal line 20 and the auxiliary ground conductor 24 (the distance therebetween in the z-axis direction) is, for example, from about 10 μm to about 100 μm, which is equal or approximately equal to the thickness T2 of the dielectric sheet 18b, as shown in FIGS. 7A and 7B. In the present preferred embodiment, the gap between the signal line 20 and the auxiliary ground conductor 24 preferably is about 50 μm, for example. That is, the distance between the auxiliary ground conductor 24 and the signal line 20 in the z-axis direction is designed to be less than the distance between the reference ground conductor 22 and the signal line 20 in the z-axis direction.

The via-hole conductor b1 pierces through the connecting portion 18a-b of the dielectric sheet 18a in the z-axis direction so as to connect the external terminal 16a to the end of the signal line 20 that is located on the negative side in the x-axis direction, as shown in FIG. 4. The via-hole conductor b2 pierces through the connecting portion 18a-c of the dielectric sheet 18a in the z-axis direction so as to connect the external terminal 16b to the end of the signal line 20 that is located on the positive side in the x-axis direction, as shown in FIG. 5. In this manner, the signal line 20 is connected between the external terminals 16a and 16b. The via-hole conductors b1 and b2 preferably are formed by filling via holes provided in the dielectric sheet 18a with a metal material.

The via-hole conductors B1 pierce through the line portion 18a-a in the sections A1 and A2 in the z-axis direction, as shown in FIGS. 4 and 5. The via-hole conductors B1 are arranged in a line in the x-axis direction and positioned on the positive side in the y-axis direction relative to the bridge portions 60, as shown in FIGS. 4 and 5. The via-hole conductors B2 pierce through the line portion 18b-a in the sections A1 and A2 in the z-axis direction, as shown in FIGS. 4 and 5. The via-hole conductors B2 are arranged in a line in the x-axis direction and positioned on the positive side in the y-axis direction relative to the bridge portions 60, as shown in FIGS. 4 and 5. The via-hole conductors B1 and B2 are connected to each other, such that each pair constitutes a single via-hole conductor, thus connecting the reference ground conductor 22 and the auxiliary ground conductor 24. The via-hole conductors B1 and B2 are formed preferably by filling via holes provided in the dielectric sheets 18a and 18b with a metal material.

The via-hole conductors B3 pierce through the line portion 18a-a in the sections A1 and A2 in the z-axis direction, as shown in FIGS. 4 and 5. The via-hole conductors B3 are arranged in a line in the x-axis direction and positioned on the negative side in the y-axis direction relative to the bridge portions 60, as shown in FIGS. 4 and 5. The via-hole conductors B4 pierce through the line portion 18b-a in the sections A1 and A2 in the z-axis direction, as shown in FIGS. 4 and 5. The via-hole conductors B4 are arranged in a line in the x-axis direction and positioned on the negative side in the y-axis direction relative to the bridge portions 60, as shown in FIGS. 4 and 5. The via-hole conductors B3 and B4 are connected to each other, such that each pair constitutes a single via-hole conductor, thus connecting the reference ground conductor 22 and the auxiliary ground conductor 24. The via-hole conductors B3 and B4 are formed preferably by filling via holes provided in the dielectric sheets 18a and 18b with a metal material.

The via-hole conductors B5 pierce through the line portion 18a-a in the section A3 in the z-axis direction, as shown in FIG. 6. The via-hole conductors B5 are arranged in the x-axis direction and positioned on the positive side in the y-axis direction relative to the bridge portions 70, as shown in FIG. 6. The via-hole conductors B6 pierce through the line portion 18b-a in the section A3 in the z-axis direction, as shown in FIG. 6. The via-hole conductors B6 are arranged in the x-axis direction and located on the positive side in the y-axis direction relative to the bridge portions 70, as shown in FIG. 6. The via-hole conductors B5 and B6 are connected to each other, such that each pair constitutes a single via-hole conductor, thus connecting the reference ground conductor 22 and the auxiliary ground conductor 24. However, the via-hole conductors B5 and B6 are not disposed at the boundaries between the portions P1 and P2 and between the portions P2 and P3, as shown in FIG. 6. The via-hole conductors B6 and B7 as described above are formed preferably by filling via holes provided in the dielectric sheets 18a and 18b with a metal material.

The via-hole conductors B7 pierce through the line portion 18a-a in the section A3 in z-axis direction, as shown in FIG. 6. The via-hole conductors B7 are arranged in the x-axis direction and positioned on the negative side in the y-axis direction relative to the bridge portions 70, as shown in FIG. 6. The via-hole conductors B8 pierce through the line portion 18b-a in the section A3 in the z-axis direction, as shown in FIG. 6. The via-hole conductors B8 are arranged in the x-axis direction and positioned on the negative side in the y-axis direction relative to the bridge portions 70, as shown in FIG. 6. The via-hole conductors B7 and B8 are connected to each other, such that each pair constitutes a single via-hole conductor, thus connecting the reference ground conductor 22 and the auxiliary ground conductor 24. However, the via-hole conductors B7 and B8 are not disposed at the boundaries between the portions P1 and P2 and between the portions P2 and P3, as shown in FIG. 6. The via-hole conductors B7 and B8 as described above are formed preferably by filling via holes provided in the dielectric sheets 18a and 18b with a metal material.

The protective layer 14 is an insulating film covering approximately the entire top surface of the dielectric sheet 18a. Accordingly, the reference ground conductor 22 is covered by the protective layer 14. The protective layer 14 is made of, for example, a flexible resin such as a resist material.

Furthermore, the protective layer 14 includes a line portion 14a and connecting portions 14b and 14c, as shown in FIG. 2. The line portion 14a covers the entire top surface of the line portion 18a-a, including the line portion 22a.

The connecting portion 14b is connected to the end of the line portion 14a on the negative side in the x-axis direction, so as to cover the top surface of the connecting portion 18a-b. The connecting portion 14b includes openings Ha to Hd provided therein. The opening Ha preferably is a rectangular or substantially rectangular opening positioned at or substantially at the center of the connecting portion 14b. The external terminal 16a is exposed to the outside from the opening Ha. The opening Hb preferably is a rectangular or substantially rectangular opening provided on the positive side in the y-axis direction relative to the opening Ha. The opening Hc preferably is a rectangular or substantially rectangular opening provided on the negative side in the x-axis direction relative to the opening Ha. The opening Hd preferably is a rectangular or substantially rectangular opening provided on the negative side in the y-axis direction relative to the opening Ha. The terminal portion 22b is exposed to the outside from the openings Hb to Hd, so that the exposed portions define and serve as external terminals.

The connecting portion 14c is connected to the end of the line portion 14a on the positive side in the x-axis direction, so as to cover the top surface of the connecting portion 18a-c. The connecting portion 14c includes openings He to Hh provided therein. The opening He preferably is a rectangular or substantially rectangular opening positioned at the center of the connecting portion 14c. The external terminal 16b is exposed to the outside from the opening He. The opening Hf preferably is a rectangular or substantially rectangular opening provided on the positive side in the y-axis direction relative to the opening He. The opening Hg preferably is a rectangular or substantially rectangular opening provided on the positive side in the x-axis direction relative to the opening He. The opening Hh preferably is a rectangular or substantially rectangular opening provided on the negative side in the y-axis direction relative to the opening He. The terminal portion 22c is exposed to the outside from the openings Hf to Hh, so that the exposed portions define and serve as external terminals.

In the flat cable 10 thus configured, the characteristic impedance of the signal line 20 switches cyclically between impedance values Z1 and Z2. More specifically, in the portions of the signal line 20 that overlap with the openings 30 and 40, there is relatively low capacitance generated between the signal line 20 and the reference ground conductor 22 and also between the signal line 20 and the auxiliary ground conductor 24. Accordingly, in the portions of the signal line 20 that overlap with the openings 30 and 40, the characteristic impedance takes the impedance value Z1, which is relatively high.

On the other hand, in the portions of the signal line 20 that overlap with the bridge portions 60 and 70, there is relatively high capacitance generated between the signal line 20 and the reference ground conductor 22 and also between the signal line 20 and the auxiliary ground conductor 24. Accordingly, in the portions of the signal line 20 that overlap with the bridge portions 60 and 70, the characteristic impedance takes the impedance value Z2, which is relatively low. The openings 30 and the bridge portions 60 are arranged so as to alternate with each other in the x-axis direction, and the openings 40 and the bridge portions 70 are arranged so as to alternate with each other in the x-axis direction. Therefore, the characteristic impedance of the signal line 20 switches cyclically between the impedance values Z1 and Z2. The impedance value Z1 preferably is, for example, about 55Ω, and the impedance value Z2 preferably is, for example, about 45Ω. Moreover, the average characteristic impedance of the entire signal line 20 preferably is, for example, about 50Ω.

The connectors 100a and 100b are mounted on the top surfaces of the connecting portions 12b and 12c, respectively, as shown in FIG. 1. The connectors 100a and 100b preferably have the same configuration, and therefore, only the configuration of the connector 100b will be described below as an example. FIGS. 8A and 8B are an oblique external view and a cross-sectional structure view of the connector 100b of the flat cable 10.

The connector 100b includes a connector body 102, external terminals 104 and 106, a center conductor 108, and an external conductor 110, as shown in FIGS. 1, 8A, and 8B. The connector body 102 includes a rectangular or substantially rectangular plate and a cylindrical or substantially cylindrical portion coupled thereon, and is made of an insulating material such as resin.

The external terminal 104 is positioned on the plate of the connector body 102 on the negative side in the z-axis direction, so as to face the external terminal 16b. The external terminal 106 is positioned on the plate of the connector body 102 on the negative side in the z-axis direction, so as to correspond to the portions of the terminal portion 22c that are exposed from the openings Hf to Hh.

The center conductor 108 is positioned at or substantially at the center of the cylindrical portion of the connector body 102, and is connected to the external terminal 104. The center conductor 108 is a signal terminal to/from which a high-frequency signal is inputted/outputted. The external conductor 110 is positioned on the inner circumferential surface of the cylindrical portion of the connector body 102, and is connected to the external terminal 106. The external conductor 110 is a ground terminal to be kept at a ground potential.

The connector 100b thus configured is mounted on the top surface of the connecting portion 12c, such that the external terminal 104 is connected to the external terminal 16b, and the external terminal 106 is connected to the terminal portion 22c, as shown in FIGS. 8A and 8B. As a result, the signal conductor 20 is electrically connected to the center conductor 108. In addition, the reference ground conductor 22 and the auxiliary ground conductor 24 are electrically connected to the external conductor 110.

The flat cable 10 is used in a manner as will be described below. FIGS. 9A and 9B illustrate an electronic device 200 provided with the flat cable 10 as viewed in plan views in the y-axis and z-axis directions, respectively.

The section A3 of the flat cable 10 is bent in a plurality of places (for example, in the present preferred embodiment, two places), so as to define a zigzag (Z-shaped) configuration when viewed in a plan view in the y-axis direction, as shown in FIG. 2, and also in a plan view in the z-axis direction, as shown in FIG. 3. In the following, the portions of the line portion 12a that are bent in the section A3 will be referred to as bending lines L1 and L2. The bending line L1 borders the portions P1 and P2, as shown in FIG. 1. The bending line L2 borders the portions P2 and P3. The bending lines L1 and L2 extend in the y-axis direction.

The portion P1 extends in the x-axis direction, and the portion P2 defines an obtuse angle θ with the portion P1 when the section A3 is not bent. The bending line L1 extends in the y-axis direction. Accordingly, in the state shown in FIG. 1, if the line portion 12a is bent inward along the bending line L1 when viewed in a plan view from the positive side in the z-axis direction, the portion P2 is oriented so as to be oblique to the positive side in the y-axis direction toward the negative side in the x-axis direction, as shown in FIG. 3. As a result, the portions P1 and P2 do not overlap except in the vicinity of the bending line L1.

Furthermore, the portion P3 extends in the x-axis direction, and the portion P2 defines an obtuse angle θ with the portion P3 when the section A3 is not bent. The bending line L2 extends in the y-axis direction. Accordingly, in the state shown in FIG. 1, if the line portion 12a is bent outward along the bending line L2 when viewed in a plan view from the positive side in the z-axis direction, the portion P3 is oriented toward the positive side in the x-axis direction, as shown in FIG. 3. As a result, the portions P2 and P3 do not overlap except in the vicinity of the bending line L2.

As described above, the portions P1 and P3 extend in the x-axis direction, and the portion P2 is angled with respect to the portions P1 and P3, so that the section A3 is bent in a zigzag manner. Accordingly, the portions of the dielectric element assembly 12 that are delimited by the bending lines L1 and L2 and are not adjacent to each other in the section A3 do not overlap when viewed in a plan view in the z-axis direction, as shown in FIG. 3. That is, the portions P1 and P3 do not overlap.

Furthermore, in the state shown in FIG. 1, if the line portion 12a is bent inward along the bending line L1 and also outward along the bending line L2, the line portion 12a is not turned bottom side up in the portions P1 and P3 but in the portion P2. Therefore, one portion that is not turned bottom side up, i.e., the portion P1, connects to the portion with the bottom side up, i.e., the portion P2, which in turn connects to the other portion that is not turned bottom side up, i.e., the portion P3.

Note that the bending line L1 borders the portions P1 and P2, and the bending line L2 borders the portions P2 and P3, but the positions of the bending lines L1 and L2 are not limited thereto. By changing the positions of the bending lines L1 and L2, the length of the section A3 in the x-axis direction is adjustable.

The flat cable 10 thus bent is preferably used in the electronic device 200, as shown in FIGS. 9A and 9B. The electronic device 200 includes the flat cable 10, circuit boards 202a and 202b, receptacles 204a and 204b, a battery pack (metallic body) 206, and a housing 210.

For example, the circuit board 202a preferably includes thereon a transmission or reception circuit including an antenna. The circuit board 202b includes, for example, a power circuit provided thereon. The battery pack 206 is, for example, a lithium-ion secondary battery, and the surface thereof is wrapped by a metal cover. The circuit board 202a, the battery pack 206, and the circuit board 202b are arranged in this order, from the negative side to the positive side in the x-axis direction.

The receptacles 204a and 204b are provided on the principal surfaces of the circuit boards 202a and 202b, respectively, on the negative side in the z-axis direction. The receptacles 204a and 204b are connected to the connectors 100a and 100b, respectively. As a result, high-frequency signals to be transmitted between the circuit boards 202a and 202b at a frequency of, for example, 2 GHz are applied to the center conductors 108 of the connectors 100a and 100b via the receptacles 204a and 204b, respectively. Moreover, the external conductors 110 of the connectors 100a and 100b are kept at a ground potential by the circuit boards 202a and 202b and the receptacles 204a and 204b. Thus, the flat cable 10 connects the circuit boards 202a and 202b.

Here, the top surface of the dielectric element assembly 12 (more precisely, the protective layer 14) is in contact with the battery pack 206. The dielectric element assembly 12 and the battery pack 206 are fixed by an adhesive or the like. The top surface of the dielectric element assembly 12 is a principal surface positioned on the side of the reference ground conductor 22 relative to the signal conductor 20. Accordingly, the reference ground conductor 22, which is in the form of a solid, is positioned between the signal conductor 20 and the battery pack 206.

A non-limiting example of a method for producing the flat cable 10 will be described below with reference to FIGS. 4 through 6. While the following description focuses on one flat cable 10 as an example, in actuality, large-sized dielectric sheets are laminated and cut, so that a plurality of flat cables 10 are produced at the same time.

Prepared first are dielectric sheets 18a to 18c made of a thermoplastic resin and having their entire top surfaces copper-foiled (i.e., coated with metal films). More specifically, copper foil is attached to the top surfaces of the dielectric sheets 18a to 18c. Further, the copper-foiled top surfaces of the dielectric sheets 18a to 18c are smoothened, for example, by galvanization for rust prevention. The dielectric sheets 18a to 18c are sheets of liquid crystal polymer. The thickness of the copper foil preferably is from about 10 μm to about 20 μm, for example.

Next, external terminals 16a and 16b and a reference ground conductor 22, as shown in FIGS. 4 through 6, are formed on the top surface of the dielectric sheet 18a by patterning the copper foil on the top surface of the dielectric sheet 18a. Specifically, resists are printed on the copper foil of the dielectric sheet 18a in the same shapes as the external terminals 16a and 16b and the reference ground conductor 22 shown in FIGS. 4 through 6. Then, any portions of the copper foil that are not coated with the resists are removed by etching the copper foil. Thereafter, the resists are removed by spraying a resist solvent. In this manner, the external terminals 16a and 16b and the reference ground conductor 22, as shown in FIGS. 4 through 6, are formed on the top surface of the dielectric sheet 18a by photolithography.

Next, a signal line 20, as shown in FIGS. 4 through 6, is formed on the top surface of the dielectric sheet 18b. In addition, an auxiliary ground conductor 24, as shown in FIGS. 4 through 6, is formed on the top surface of the dielectric sheet 18c. Note that the steps for forming the signal line 20 and the auxiliary ground conductor 24 are the same as the steps for forming the external terminals 16a and 16b and the ground conductor 22, and therefore, any descriptions thereof will be omitted.

Next, via holes are bored through the dielectric sheets 18a and 18b by irradiating their surfaces with laser beams where via-hole conductors b1, b2, and B1 to B8 are to be formed. Thereafter, the via holes provided in the dielectric sheets 18a and 18b are filled with a conductive paste, thus completing the via-hole conductors b1, b2, and B1 to B8.

Next, the dielectric sheets 18a to 18c are stacked in this order, from the positive side to the negative side in the z-axis direction, thus providing a dielectric element assembly 12. Then, the dielectric sheets 18a to 18c are heated and pressed from both the positive and negative sides in the z-axis direction, thus integrating the dielectric sheets 18a to 18c.

Next, a resin (resist) paste is applied to the top surface of the dielectric sheet 18a, thus forming a protective layer 14 so as to cover the reference ground conductor 22.

Lastly, connectors 100a and 100b are mounted on the connecting portions 12b and 12c by soldering them to the external terminals 16a and 16b and the terminal portions 22b and 22c. As a result, the flat cable 10 shown in FIG. 1 is provided.

The flat cable 10 thus configured does not become excessively thick in any portion when it is bent to adjust the length. More specifically, the length of the flat cable 10 preferably is adjusted by bending the section A3 in two places so as to define a zigzag portion when viewed in a plan view in the z-axis direction. Accordingly, the portions P1 and P3 of the dielectric element assembly 12, which are delimited by the bending lines L1 and L2 and are not adjacent to each other in the section A3, do not overlap when viewed in a plan view in the z-axis direction. Therefore, the portions P1 to P3, when viewed in a plan view in the z-axis direction, do not overlap in the same place. Thus, the flat cable 10 is prevented from becoming excessively thick in any portion.

Further, even when the flat cable 10 is bent in the section A3 in a zigzag manner, the width of the flat cable 10 in the y-axis direction is prevented from becoming excessively large. More specifically, in the case where the flat cable 10 is bent in the section A3 in a zigzag manner, the width of the entire section A3 in the y-axis direction increases. However, in the flat cable 10, the width W2 of the section A3 in the y-axis direction is less than the width W1 of the section A1 in the y-axis direction. Therefore, even when the section A3 is bent in a zigzag manner, the width of the entire section A3 in the y-axis direction is prevented from becoming excessively large. Thus, the width of the flat cable 10 in the y-axis direction is prevented from becoming excessively large as well.

Still further, since the via-hole conductors B5 to B8 are formed by filling via holes with a conductor material, they are harder than the dielectric element assembly 12. Therefore, in the flat cable 10, the via-hole conductors B5 to B8 are not provided at the bending lines L1 and L2. Thus, the line portion 12a of the flat cable 10 is bent readily along the bending lines L1 and L2.

Yet further, the flat cable 10 is made thin. More specifically, the flat cable 10 includes the openings 30 and 40 provided in the auxiliary ground conductor 24. Accordingly, less capacitance is generated between the signal line 20 and the auxiliary ground conductor 24. Therefore, even if the distance between the signal line 20 and the auxiliary ground conductor 24 in the z-axis direction is reduced, the capacitance generated between the signal line 20 and the auxiliary ground conductor 24 is prevented from becoming excessively high. As a result, the characteristic impedance of the signal line 20 is less likely to deviate from a predetermined impedance value (e.g., about 50Ω). Thus, it is possible to make the flat cable 10 thin while maintaining the characteristic impedance of the signal line 20 at the predetermined impedance value.

Yet further, in the case where the flat cable 10 is attached to a metallic body such as the battery pack 206, fluctuations in characteristic impedance of the signal line 20 are prevented. More specifically, the flat cable 10 is attached to the battery pack 206, such that the reference ground conductor 22, which is in the form of a solid, is positioned between the signal line 20 and the battery pack 206, except in the portion P2. Accordingly, the signal line 20 does not face the battery pack 206 through any openings, which prevents capacitance from being generated between the signal line 20 and the battery pack 206. As a result, attaching the flat cable 10 to the battery pack 206 prevents the characteristic impedance of the signal line 20 from being reduced.

Yet further, the flat cable 10 renders it possible to inhibit the characteristic impedance of the signal line 20 from fluctuating. More specifically, the section A3 of the flat cable 10 preferably is bent in two places in a zigzag manner when viewed in a plan view in the z-axis direction. Accordingly, the portions P1, P2, and P3 do not overlap significantly when viewed in a plan view in the z-axis direction. Therefore, no sections of the signal line 20 significantly overlap with one another when viewed in a plan view in the z-axis direction. Thus, it is possible to prevent capacitance from being generated between any sections of the signal line 20, thus preventing the characteristic impedance of the signal line 20 from fluctuating.

First Modification

Hereinafter, the configuration of a flat cable according to a first modification of the first preferred embodiment will be described with reference to the drawings. FIG. 10A is a top view of the flat cable 10a according to the first modification. FIG. 10B is a top view where the flat cable 10a in FIG. 10A is bent.

The flat cable 10a differs from the flat cable 10 in the shape of the section A2. More specifically, the section A3 of the flat cable 10a is oblique to the positive side in the y-axis direction toward the positive side in the x-axis direction, as shown in FIG. 10A. That is, the portions P1 to P3 define a straight line.

The section A3 of the flat cable 10a is preferably bent in two places along the bending lines L1 and L2, so as to define a zigzag (Z-shaped) configuration when viewed in a plan view in the y-axis direction, and also in a plan view in the z-axis direction, as shown in FIG. 10B.

The flat cable 10a thus configured, as with the flat cable 10, is prohibited from becoming excessively thick in any portion when it is adjusted in length.

Second Modification

Hereinafter, the configuration of a flat cable according to a second modification of the first preferred embodiment will be described with reference to the drawings. FIG. 11A is a top view of the flat cable 10b according to the second modification. FIG. 11B is a top view where the flat cable 10b in FIG. 11A is bent.

The flat cable 10b differs from the flat cable 10 in the shape of the section A3. More specifically, the section A3 of the flat cable 10b extends in the x-axis direction, as shown in FIG. 11A. That is, the portions P1 to P3 define a straight line.

Furthermore, the end of the section A3 that is located on the negative side in the x-axis direction is connected to the corner of the section A1 where the positive side in the x-axis direction meets the negative side in the y-axis direction, as shown in FIG. 11A. Moreover, the end of the section A3 that is located on the positive side in the x-axis direction is connected to the corner of the section A2 where the negative side in the x-axis direction meets the positive side in the y-axis direction. Accordingly, when the flat cable 10b is not bent, as shown in FIG. 11A, the section A1 is positioned on the positive side in the y-axis direction relative to the section A2.

The bending line L1 of the flat cable 10b is oblique to the positive side in the y-axis direction toward the positive side in the x-axis direction, as shown in FIG. 11A. Moreover, the bending line L2 is also oblique to the positive side in the y-axis direction toward the positive side in the x-axis direction, as shown in FIG. 11A. Accordingly, the section A3 of the flat cable 10b is preferably bent in two places along the bending lines L1 and L2, so as to define a zigzag (Z-shaped) configuration when viewed in a plan view in the y-axis direction, and also in a plan view in the z-axis direction, as shown in FIG. 11B.

The flat cable 10b thus configured, as with the flat cable 10, is prevented from becoming excessively thick in any portion when it is adjusted in length.

Furthermore, in the state where the section A3 is bent in a zigzag manner, as shown in FIG. 11B, the section A2 is positioned on the positive side in the y-axis direction compared to the state where the section A3 is not bent, as shown in FIG. 11A. Accordingly, in the state shown in FIG. 11A, the section A1 is positioned on the positive side in the y-axis direction relative to the section A2. Therefore, when the section A3 is bent in a zigzag manner, as shown in FIG. 11B, the sections A1 and A2 are aligned in the y-axis direction. Thus, the width of the entire flat cable 10b in the y-axis direction is prevented from increasing when the section A3 is bent in a zigzag manner.

Third Modification

Hereinafter, the configuration of a flat cable according to a third modification of the first preferred embodiment will be described with reference to the drawings. FIG. 12A is a top view of the flat cable 10c according to the third modification. FIG. 12B is a top view where the flat cable 10c in FIG. 12A is bent.

The flat cable 10c differs from the flat cable 10b in the width W2 of the section A3. More specifically, in the flat cable 10c, the width W2 of the section A3 in the y-axis direction is equal or substantially equal to the width W1 of each of the sections A1 and A2 in the y-axis direction.

The flat cable 10c thus configured, as with the flat cable 10, is prevented from becoming excessively thick in any portion when it is adjusted in length. Although the width of the entire flat cable 10c in the y-axis direction increases, the width W1 of each of the sections A1 and A2 preferably is equal or substantially equal to the width W2 of the section A3, which eliminates the need to design the sections A1 to A3 differently, thus facilitating the design of the flat cable 10c.

Second Preferred Embodiment

Figure 13:
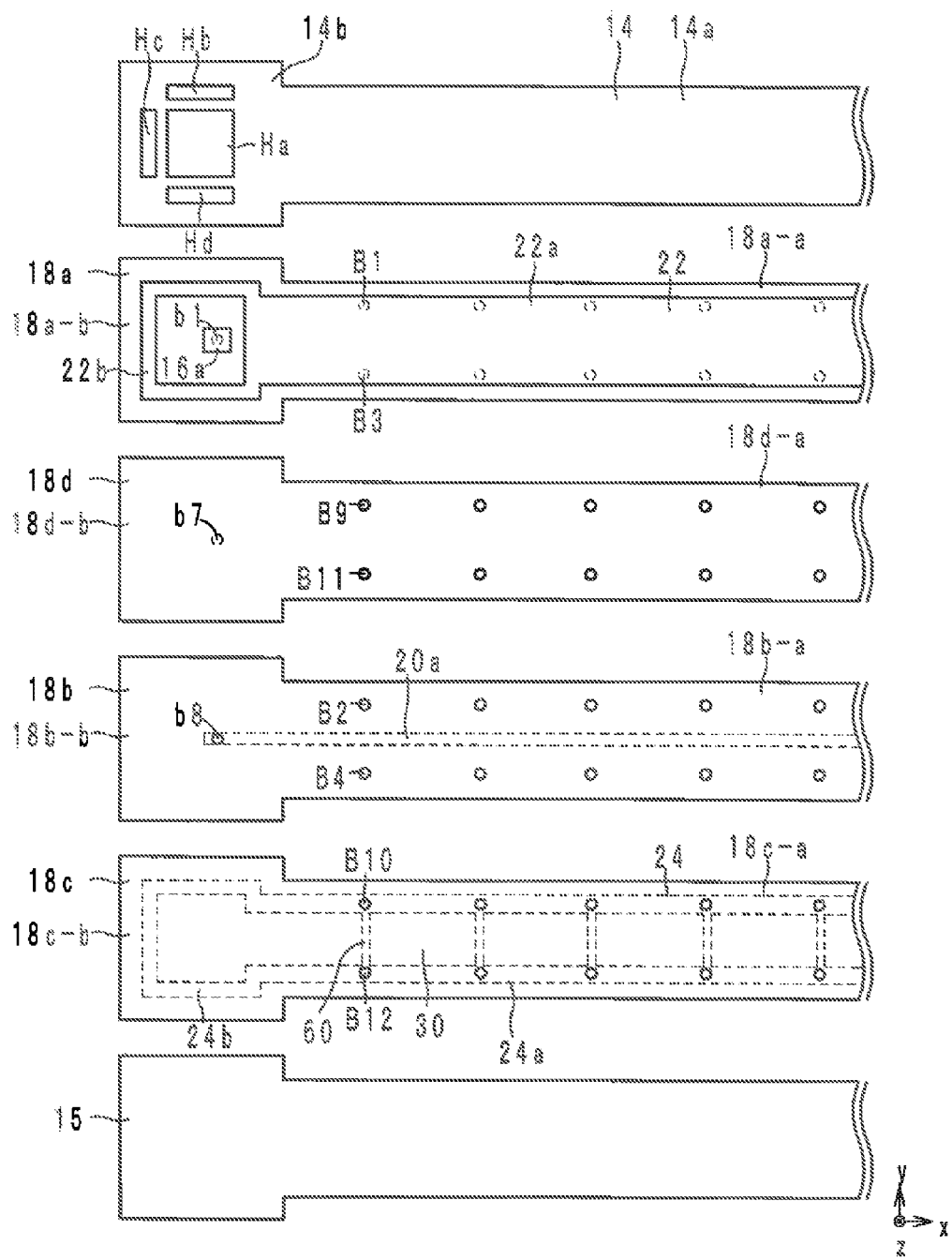
FIG. 13 is an exploded view of a flat cable according to a second preferred embodiment of the present invention.
Figure 14:
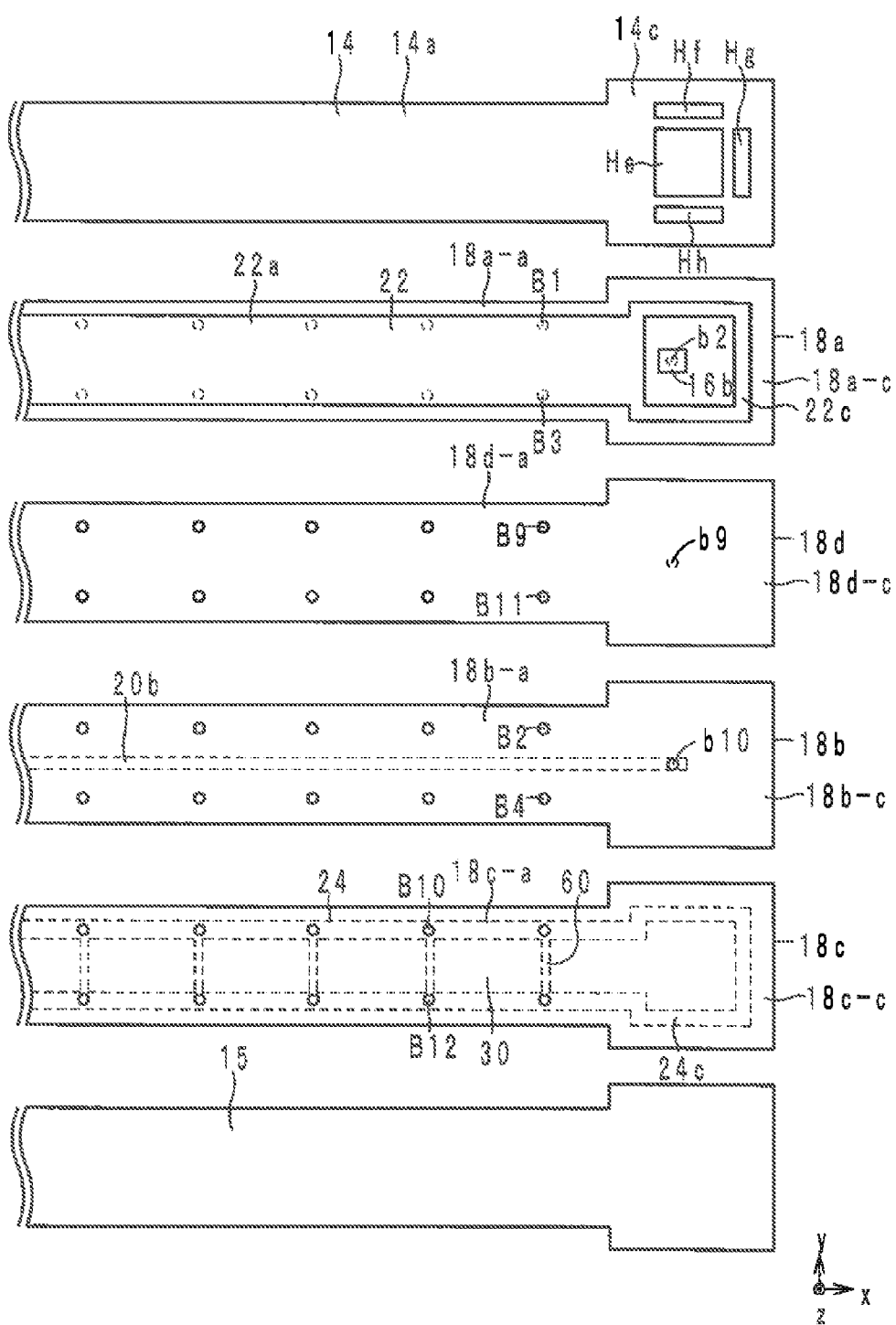
FIG. 14 is another exploded view of the flat cable according to the second preferred embodiment of the present invention.
Figure 15:
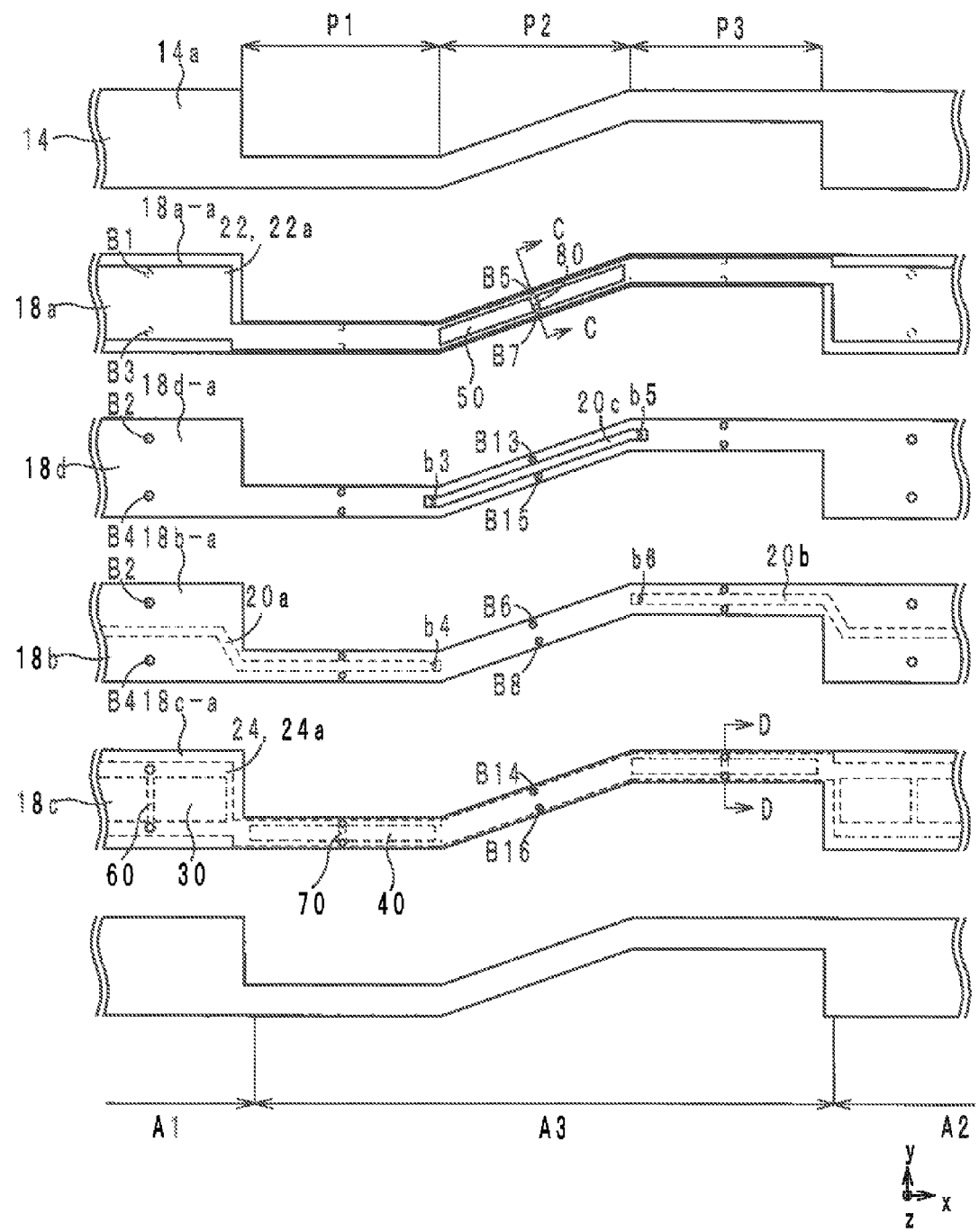
FIG. 15 is still another exploded view of the flat cable according to the second preferred embodiment of the present invention.
Figure 16A:
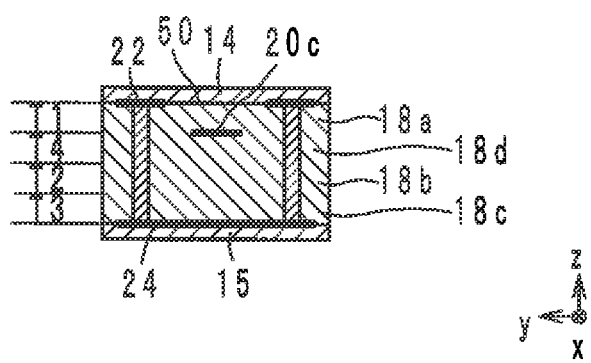
FIG. 16A is a cross-sectional structure view taken along line C-C of FIG. 15.
Figure 16B:
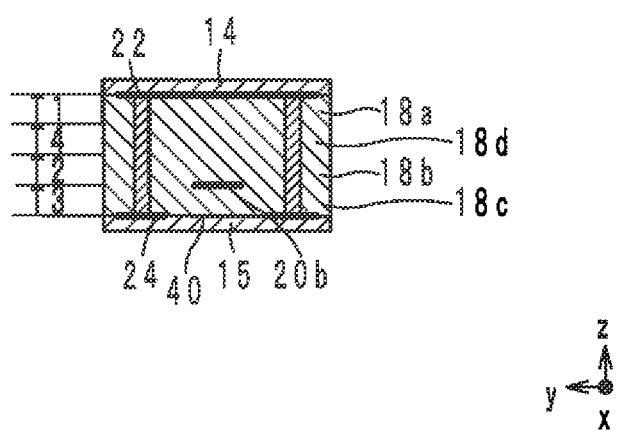
FIG. 16B is a cross-sectional structure view taken along line D-D of FIG. 15.
Figure 17A:
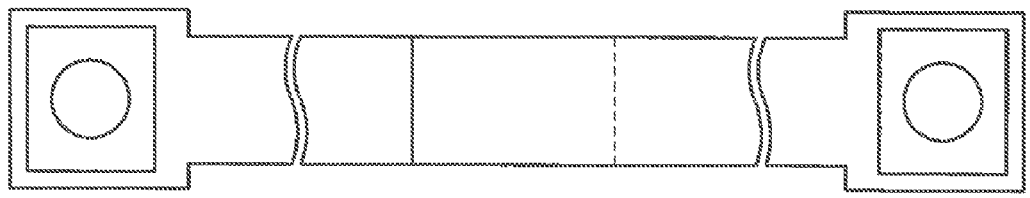
FIG. 17A is a top view of a high-frequency signal line described in International Publication WO 2012/073591.
Figure 17B:
FIG. 17B is a side view of the high-frequency signal line described in International Publication WO 2012/073591.

Hereinafter, the configuration of a flat cable according to a second preferred embodiment of the present invention will be described with reference to the drawings. FIGS. 13 through 15 are exploded views of the flat cable 10d according to the second preferred embodiment. FIG. 16A is a cross-sectional structure view taken along line C-C of FIG. 15. FIG. 16B is a cross-sectional structure view taken along line D-D of FIG. 15. Note that FIGS. 1 and 2 will be referenced for the external oblique views of the flat cable 10d, and FIG. 3 will be referenced for the top view of the flat cable 10d.

The flat cable 10d differs from the flat cable 10 in that signal lines 20a to 20c are provided, and the reference ground conductor 22 is provided with openings 50 and abridge portion 80. The flat cable 10d will be described in more detail below.

The flat cable 10d includes a dielectric element assembly 12, external terminals 16a and 16b, signal lines 20a to 20c, a reference ground conductor 22, an auxiliary ground conductor 24, via-hole conductors (inter-layer connecting portions) b1 to b10 and B1 to B16, and connectors 100a and 100b, as shown in FIGS. 1 through 3 and 13 through 15.

The dielectric element assembly 12 is a flexible plate-shaped member extending in the x-axis direction when viewed in a plan view in the z-axis direction, and includes a line portion 12a and connecting portions 12b and 12c, as shown in FIG. 1. The dielectric element assembly 12 is a laminate including a protective layer 14, a dielectric sheet 18a, a dielectric sheet 18d, a dielectric sheet 18b, a dielectric sheet 18c, and a protective layer 15 laminated in this order, from the positive side to the negative side in the z-axis direction, as shown in FIGS. 13 through 15. In the following, the principal surface of the dielectric element assembly 12 that is located on the positive side in the z-axis direction will be referred to as a top surface, and the principal surface of the dielectric element assembly 12 that is located on the negative side in the z-axis direction will be referred to as a bottom surface.

The line portion 12a extends in the x-axis direction, and includes sections A1 to A3, as shown in FIG. 1. The sections A1 to A3 of the flat cable 10d are the same as those of the flat cable 10, and therefore, any descriptions thereof will be omitted. The section A2 extends in the x-axis direction, and includes portions P1 to P3. The portions P1 to P3 of the flat cable 10d are preferably the same as those of the flat cable 10, and therefore, any descriptions thereof will be omitted.

The dielectric sheets 18a to 18d, when viewed in a plan view in the z-axis direction, extend in the x-axis direction, and have the same shape as the dielectric element assembly 12, as shown in FIGS. 13 through 16. The dielectric sheets 18a to 18d are made of a flexible thermoplastic resin such as polyimide or liquid crystal polymer. In the following, the principal surfaces of the dielectric sheets 18a to 18c that are located on the positive side in the z-axis direction will be referred to as top surfaces, and the principal surfaces of the dielectric sheets 18a to 18c that are located on the negative side in the z-axis direction will be referred to as bottom surfaces.

The thickness T1 of the dielectric sheet 18a, the thickness T2 of the dielectric sheet 18b, the thickness T3 of the dielectric sheet 18c, and the thickness T4 of the dielectric sheet 18d are equal, as shown in FIGS. 16A and 16B. After lamination of the dielectric sheets 18a to 18d, the thicknesses T1 to T4 are, for example, from 10 μm to 100 μm. In the present preferred embodiment, the thicknesses T1 to T4 are 50 μm.

Furthermore, the dielectric sheet 18*a* includes a line portion 18*a*-*a* and connecting portions 18*a*-*b* and 18*a*-*c*. The dielectric sheet 18*b* includes a line portion 18*b*-*a* and connecting portions 18*b*-*b* and 18*b*-*c*. The dielectric sheet 18*c* includes a line portion 18*c*-*a* and connecting portions 18*c*-*b* and 18*c*-*c*. The dielectric sheet 18*d* includes a line portion 18*d*-*a* and connecting portions 18*d*-*b* and 18*d*-*c*. The line portions 18*a*-*a*, 18*b*-*a*, 18*c*-*a*, and 18*d*-*a* constitute the line portion 12*a*. The connecting portions 18*a*-*b*, 18*b*-*b*, 18*c*-*b*, and 18*d*-*b* constitute the connecting portion 12*b*. The connecting portions 18*a*-*c*, 18*b*-*c*, 18*c*-*c*, and 18*d*-*c* constitute the connecting portion 12*c*.

The signal line 20*a* is a linear conductor provided in the dielectric element assembly 12 for the purpose of high-frequency signal transmission, as shown in FIGS. 13 through 15. In the present preferred embodiment, the signal line 20*a* is preferably provided on the bottom surface of the dielectric sheet 18*b*. The signal line 20*a* extends through the section A1 and the portion P1 in the x-axis direction. The signal line 20*a* is positioned at the center of the line portion 18*b*-*a* in the y-axis direction. The end of the signal line 20*a* that is located on the negative side in the x-axis direction is positioned at the center of the connecting portion 18*b*-*b*, as shown in FIG. 13. The end of the signal line 20*a* that is located on the positive side in the x-axis direction coincides with the end of the portion P1 that is located on the negative side in the x-axis direction, as shown in FIG. 15. The signal line 20*a* preferably has a width of, for example, from about 300 μm to about 700 μm. In the present preferred embodiment, the width of the signal line 20*a* preferably is about 300 μm, for example. The signal line 20*a* preferably is made of a metal material mainly composed of silver or copper and having a low specific resistance. Here, the signal line 20*a* preferably is formed on the bottom surface of the dielectric sheet 18*b* by patterning metal foil formed by plating the bottom surface of the dielectric sheet 18*b* or by patterning metal foil attached to the bottom surface of the dielectric sheet 18*b*. Moreover, the bottom surface of the signal conductor 20*a* is smoothened, so that surface roughness of the signal conductor 20*a* is greater on the side that contacts the dielectric sheet 18*b* than on the side that does not contact the dielectric sheet 18*b*.

The signal line 20*b* is a linear conductor provided in the dielectric element assembly 12 for the purpose of high-frequency signal transmission, as shown in FIGS. 13 through 15. In the present preferred embodiment, the signal line 20*b* is provided on the bottom surface of the dielectric sheet 18*b*. The signal line 20*b* extends through the section A2 and the portion P3 in the x-axis direction. The signal line 20*b* is positioned at the center of the line portion 18*b*-*a* in the y-axis direction. The end of the signal line 20*b* that is located on the positive side in the x-axis direction is positioned at the center of the connecting portion 18*b*-*c*, as shown in FIG. 14. The end of the signal line 20*b* that is located on the negative side in the x-axis direction coincides with the end of the portion P3 that is located on the negative side in the x-axis direction, as shown in FIG. 15. The signal line 20*b* preferably has a width of, for example, from about 300 μm to about 700 μm. In the present preferred embodiment, the width of the signal line 20*b* preferably is about 300 μm, for example. The signal line 20*b* is preferably made of a metal material mainly composed of silver or copper and having a low specific resistance. Here, the signal line 20*b* is preferably provided on the bottom surface of the dielectric sheet 18*b* preferably by patterning metal foil formed by plating the bottom surface of the dielectric sheet 18*b* or by patterning metal foil attached to the bottom surface of the dielectric sheet 18*b*. Moreover, the top surface of the signal conductor 20*b* is smoothened, so that surface roughness of the signal conductor 20*b* is greater on the side that contacts the dielectric sheet 18*b* than on the side that does not contact the dielectric sheet 18*b*.

The signal line 20*c* is a linear conductor provided in the dielectric element assembly 12 for the purpose of high-frequency signal transmission, as shown in FIG. 15. In the present preferred embodiment, the signal line 20*c* is provided on the top surface of the dielectric sheet 18*d*. The signal line 20*c* extends through the portion P2 in the x-axis direction. The signal line 20*c* is preferably positioned at or substantially at the center of the line portion 18*d*-*a* in the y-axis direction. The end of the signal line 20*c* that is located on the negative side in the x-axis direction coincides with the end of the portion P1 that is located on the positive side in the x-axis direction, as shown in FIG. 15. The end of the signal line 20*c* that is located on the positive side in the x-axis direction coincides with the end of the portion P3 that is located on the negative side in the x-axis direction, as shown in FIG. 15. The signal line 20*c* preferably has a width of, for example, from about 300 μm to about 700 μm. In the present preferred embodiment, the width of the signal line 20*c* preferably is about 300 μm. The signal line 20*c* is preferably made of a metal material mainly composed of silver or copper and having a low specific resistance. Here, the signal line 20*c* is preferably provided on the top surface of the dielectric sheet 18*d* preferably by patterning metal foil formed by plating the top surface of the dielectric sheet 18*d* or by patterning metal foil attached to the top surface of the dielectric sheet 18*d*. Moreover, the top surface of the signal conductor 20*c* is smoothened, so that surface roughness of the signal conductor 20*c* is greater on the side that contacts the dielectric sheet 18*d* than on the side that does not contact the dielectric sheet 18*d*.

The via-hole conductor b3 pierces through the line portion 18*d*-*a* in the z-axis direction near the end of the portion P1 that is located on the positive side in the x-axis direction, as shown in FIG. 15. The via-hole conductor b4 pierces through the line portion 18*b*-*a* in the z-axis direction near the end of the portion P1 that is located on the positive side in the x-axis direction, as shown in FIG. 15. The via-hole conductors b3 and b4 are connected to each other to constitute a single via-hole conductor, thus connecting the end of the signal line 20*a* that is located on the positive side in the x-axis direction to the end of the signal line 20*c* that is located on the negative side in the x-axis direction. The via-hole conductor b3 preferably is formed by filling a via hole provided in the dielectric sheet 18*d* with a metallic material. The via-hole conductor b4 preferably is formed by filling a via hole provided in the dielectric sheet 18*b* with a metallic material.

The via-hole conductor b5 pierces through the line portion 18*d*-*a* in the z-axis direction near the end of the portion P3 that is located on the negative side in the x-axis direction, as shown in FIG. 15. The via-hole conductor b6 pierces through the line portion 18*b*-*a* in the z-axis direction near the end of the portion P3 that is located on the negative side in the x-axis direction, as shown in FIG. 15. The via-hole conductors b5 and b6 are connected to each other to constitute a single via-hole conductor, thereby connecting the end of the signal line 20*b* that is located on the negative side in the x-axis direction to the end of the signal line 20*c* that is located on the positive side in the x-axis direction. The via-hole conductor b5 preferably is formed by filling a via hole provided in the dielectric sheet 18d with a metallic material. The via-hole conductor b6 preferably is formed by filling a via hole provided in the dielectric sheet 18b with a metallic material. In this manner, the signal lines 20a to 20c are connected as a single signal line.

The reference ground conductor 22 is positioned on the positive side in the z-axis direction relative to the signal lines 20a to 20c, as shown in FIGS. 13 through 15. The reference ground conductor 22 of the flat cable 10d preferably is the same as that of the flat cable 10 except that it is provided with the openings 50 and the bridge portion 80. Accordingly, the openings 50 and the bridge portion 80 will be described below.

The line portion 22a is provided with the openings 50, each having an elongated rectangular or substantially rectangular shape and extending in the x-axis direction, as shown in FIG. 15. More specifically, the openings 50 are provided in the line portion 22a along the signal line 20 in the portion P2. Moreover, the bridge portion 80 is positioned between the openings 50 in the line portion 22a in the portion P2. The bridge portion 80 is a linear conductor extending in the y-axis direction. Accordingly, the line portion 22a has a ladder-shaped configuration in the portion P2. The openings 50 and the bridge portion 80, when viewed in a plan view in the z-axis direction, overlap with the signal line 20c alternatingly. In the present preferred embodiment, the signal line 20c is oriented obliquely to the x-axis direction so as to pass through the centers of the openings 50 and the bridge portion 80 in the y-axis direction.

The auxiliary ground conductor 24 is positioned on the negative side in the z-axis direction relative to the signal lines 20a to 20c, as shown in FIGS. 13 through 15. The auxiliary ground conductor 24 of the flat cable 10d differs from that of the flat cable 10 in that it is provided on the bottom surface of the dielectric sheet 18c and provided with neither the openings 40 nor the bridge portions 70 in the portion P2.

The external terminals 16a and 16b of the flat cable 10d are the same as those of the flat cable 10.

In this manner, the signal lines 20a to 20c are positioned between the reference ground conductor 22 and the auxiliary ground conductor 24 in the z-axis direction. That is, the signal lines 20a to 20c, the reference ground conductor 22, and the auxiliary ground conductor 24 define a tri-plate stripline structure.

Furthermore, the gap between the signal line 20a or 20b and the reference ground conductor 22 (the distance therebetween in the z-axis direction) is, for example, about 150 μm, which is equal or approximately equal to the total of the thickness T1 of the dielectric sheet 18a, the thickness T4 of the dielectric sheet 18d, and the thickness T2 of the dielectric sheet 18b, as shown in FIGS. 13 through 15. On the other hand, the gap between the signal line 20a or 20b and the auxiliary ground conductor 24 (the distance therebetween in the z-axis direction) preferably is, for example, about 50 μm, which is equal to or approximately equal to the thickness T3 of the dielectric sheet 18c, as shown in FIGS. 13 through 15. That is, in the sections A1 and A2 and the portions P1 and P3, the distance between the auxiliary ground conductor 24 and the signal line 20a or 20b in the z-axis direction is designed to be less than the distance between the reference ground conductor 22 and the signal line 20a or 20b in the z-axis direction. The reason for this is that, since the auxiliary ground conductor 24 includes the openings 30 and 40 provided in the sections A1 and A2 and the portions P1 and P3, the signal lines 20a and 20b are disposed close to the auxiliary ground conductor 24 without causing the characteristic impedance of the signal lines 20a and 20b to fluctuate significantly.

Furthermore, the gap between the signal line 20c and the reference ground conductor 22 (the distance therebetween in the z-axis direction) is, for example, about 50 μm, which is equal or approximately equal to the thickness T1 of the dielectric sheet 18a, as shown in FIG. 15. On the other hand, the gap between the signal line 20c and the auxiliary ground conductor 24 (the distance therebetween in the z-axis direction) preferably is, for example, about 150 μm, which is equal or approximately equal to the total of the thickness T4 of the dielectric sheet 18d, the thickness T2 of the dielectric sheet 18b, and the thickness T3 of the dielectric sheet 18c, as shown in FIG. 15. That is, in the portion P2, the distance between the auxiliary ground conductor 24 and the signal line 20c in the z-axis direction is designed to be greater than the distance between the reference ground conductor 22 and the signal line 20c in the z-axis direction. The reason for this is that, since the reference ground conductor 22 includes the openings 50 provided in the portion P2, the signal line 20c is disposed close to the reference ground conductor 22 without causing the characteristic impedance of the signal line 20c to fluctuate significantly.

The via-hole conductor b1 pierces through the connecting portion 18a-b of the dielectric sheet 18a in the z-axis direction, as shown in FIG. 13. The via-hole conductor b7 pierces through the connecting portion 18d-b of the dielectric sheet 18d in z-axis direction, as shown in FIG. 13. The via-hole conductor b8 pierces through the connecting portion 18b-b of the dielectric sheet 18b in the z-axis direction, as shown in FIG. 4. The via-hole conductors b1, b7, and b8 are connected together to constitute a single via-hole conductor, thus connecting the external terminal 16a and the end of the signal line 20a that is located on the negative side in the x-axis direction.

The via-hole conductor b2 pierces through the connecting portion 18a-c of the dielectric sheet 18a in the z-axis direction, as shown in FIG. 14. The via-hole conductor b9 pierces through the connecting portion 18d-c of the dielectric sheet 18d in the z-axis direction, as shown in FIG. 14. The via-hole conductor b10 pierces through the connecting portion 18b-c of the dielectric sheet 18b in the z-axis direction, as shown in FIG. 14. The via-hole conductors b2, b9, and b10 are connected together to constitute a single via-hole conductor, thus connecting the external terminal 16b and the end of the signal line 20b that is located on the positive side in the x-axis direction. In this manner, the signal lines 20a to 20c are connected between the external terminals 16a and 16b. The via-hole conductors b1, b2, and b7 to b10 are formed preferably by filling via holes provided in the dielectric sheets 18a, 18b, and 18d with a metal material.

The via-hole conductors B1 pierce through the line portion 18a-a in the sections A1 and A2 in the z-axis direction, as shown in FIGS. 13 and 14. The via-hole conductors B1 are arranged in a line in the x-axis direction on the positive side in the y-axis direction relative to the bridge portions 60, as shown in FIGS. 13 and 14. The via-hole conductors B9 pierce through the line portion 18d-a in the sections A1 and A2 in the z-axis direction, as shown in FIGS. 13 and 14. The via-hole conductors B9 are arranged in a line in the x-axis direction on the positive side in the y-axis direction relative to the bridge portions 60, as shown in FIGS. 13 and 14. The via-hole conductors B2 pierce through the line portion 18b-a in the sections A1 and A2 in the z-axis direction, as shown in FIGS. 13 and 14. The via-hole conductors B2 are arranged in a line in the x-axis direction on the positive side in the y-axis direction relative to the bridge portions 60, as shown in FIGS. 13 and 14. The via-hole conductors B10 pierce through the line portion 18c-a in the sections A1 and A2 in the z-axis direction, as shown in FIGS. 13 and 14. The via-hole conductors B10 are arranged in a line in the x-axis direction on the positive side in the y-axis direction relative to the bridge portions 60, as shown in FIGS. 13 and 14. The via-hole conductors B1, B9, B2, and B10 are connected to one another, such that each set constitutes a single via-hole conductor, thus connecting the reference ground conductor 22 and the auxiliary ground conductor 24. The via-hole conductors B1, B9, B2, and B10 are formed preferably by filling via holes provided in the dielectric sheets 18a, 18d, 18b, and 18c, respectively, with a metal material.

The via-hole conductors B3 pierce through the line portion 18a-a in the sections A1 and A2 in the z-axis direction, as shown in FIGS. 13 and 14. The via-hole conductors B3 are arranged in a line in the x-axis direction on the negative side in the y-axis direction relative to the bridge portions 60, as shown in FIGS. 13 and 14. The via-hole conductors B11 pierce through the line portion 18d-a in the sections A1 and A2 in the z-axis direction, as shown in FIGS. 13 and 14. The via-hole conductors B11 are arranged in a line in the x-axis direction on the negative side in the y-axis direction relative to the bridge portions 60, as shown in FIGS. 13 and 14. The via-hole conductors B4 pierce through the line portion 18b-a in the sections A1 and A2 in the z-axis direction, as shown in FIGS. 13 and 14. The via-hole conductors B4 are arranged in a line in the x-axis direction on the negative side in the y-axis direction relative to the bridge portions 60, as shown in FIGS. 13 and 14. The via-hole conductors B12 pierce through the line portion 18c-a in the sections A1 and A2 in the z-axis direction, as shown in FIGS. 13 and 14. The via-hole conductors B12 are arranged in a line in the x-axis direction on the negative side in the y-axis direction relative to the bridge portions 60, as shown in FIGS. 13 and 14. The via-hole conductors B3, B11, B4, and B12 are connected to one another, such that each set constitutes a single via-hole conductor, thus connecting the reference ground conductor 22 and the auxiliary ground conductor 24. The via-hole conductors B3, B11, B4, and B12 are formed preferably by filling via holes provided in the dielectric sheets 18a, 18d, 18b, and 18c, respectively, with a metal material.

The via-hole conductors B5 pierce through the line portion 18a-a in the section A3 in the z-axis direction, as shown in FIG. 15. The via-hole conductors B5 are arranged in the x-axis direction on the positive side in the y-axis direction relative to the bridge portions 70, as shown in FIG. 15. The via-hole conductors B13 pierce through the line portion 18d-a in the section A3 in the z-axis direction, as shown in FIG. 15. The via-hole conductors B13 are arranged in the x-axis direction on the positive side in the y-axis direction relative to the bridge portions 70, as shown in FIG. 15. The via-hole conductors B6 pierce through the line portion 18b-a in the section A3 in the z-axis direction, as shown in FIG. 15. The via-hole conductors B6 are arranged in the x-axis direction on the positive side in the y-axis direction relative to the bridge portions 70, as shown in FIG. 15. The via-hole conductors B14 pierce through the line portion 18c-a in the section A3 in the z-axis direction, as shown in FIG. 15. The via-hole conductors B14 are arranged in the x-axis direction on the positive side in the y-axis direction relative to the bridge portions 70, as shown in FIG. 15. The via-hole conductors B5, B13, B6, and B14 are connected to one another, such that each set constitutes a single via-hole conductor, thus connecting the reference ground conductor 22 and the auxiliary ground conductor 24. However, the via-hole conductors B5, B13, B6, and B14 are not disposed at the boundaries between the portions P1 and P2 and between the portions P2 and P3, as shown in FIG. 15. The via-hole conductors B5, B13, B6, and B14 are formed preferably by filling via holes provided in the dielectric sheets 18a, 18d, 18b, and 18c, respectively, with a metal material.

The via-hole conductors B7 pierce through the line portion 18a-a in the section A3 in the z-axis direction, as shown in FIG. 15. The via-hole conductors B7 are arranged in the x-axis direction on the negative side in the y-axis direction relative to the bridge portions 70, as shown in FIG. 15. The via-hole conductors B15 pierce through the line portion 18d-a in the section A3 in the z-axis direction, as shown in FIG. 15. The via-hole conductors B15 are arranged in the x-axis direction on the negative side in the y-axis direction relative to the bridge portions 70, as shown in FIG. 15. The via-hole conductors B8 pierce through the line portion 18b-a in the section A3 in the z-axis direction, as shown in FIG. 15. The via-hole conductors B8 are arranged in the x-axis direction on the negative side in the y-axis direction relative to the bridge portions 70, as shown in FIG. 15. The via-hole conductors B16 pierce through the line portion 18c-a in the section A3 in the z-axis direction, as shown in FIG. 15. The via-hole conductors B16 are arranged in the x-axis direction on the negative side in the y-axis direction relative to the bridge portions 70, as shown in FIG. 15. The via-hole conductors B7, B15, B8, and B16 are connected to one another, such that each set constitutes a single via-hole conductor, thus connecting the reference ground conductor 22 and the auxiliary ground conductor 24. However, the via-hole conductors B7, B15, B8, and B16 are not disposed at the boundaries between the portions P1 and P2 and between the portions P2 and P3, as shown in FIG. 15. The via-hole conductors B7, B15, B8, and B16 are formed preferably by filling via holes provided in the dielectric sheets 18a, 18d, 18b, and 18c, respectively, with a metal material.

The protective layer 14 is an insulating film covering approximately the entire top surface of the dielectric sheet 18a. Accordingly, the reference ground conductor 22 is covered by the protective layer 14. The protective layer 14 is made of, for example, a flexible resin such as a resist material. The protective layer 14 of the flat cable 10d is preferably the same as that of the flat cable 10.

The protective layer 15 is an insulating film covering approximately the entire bottom surface of the dielectric sheet 18c. Accordingly, the auxiliary ground conductor 24 is covered by the protective layer 15. The protective layer 15 is made of, for example, a flexible resin such as a resist material.

The connectors 100a and 100b of the flat cable 10d preferably are the same as those of the flat cable 10.

Furthermore, the flat cable 10d preferably is used in the same manner as the flat cable 10.

The flat cable 10d thus configured, as with the flat cable 10, is prevented from becoming excessively thick in any portion when it is adjusted in length.

Furthermore, in the case where the flat cable 10d is attached to a metallic body such as the battery pack 206, fluctuations in characteristic impedance of the signal line 20 are prevented more effectively. More specifically, in the flat cable 10d, the top surface of the dielectric element assembly 12 (more precisely, the protective layer 14) contacts the battery pack 206. In addition, when the flat cable 10d is viewed in a plan view in the z-axis direction, the section A3 has a zigzag shape. Accordingly, the line portion 12a is not turned bottom side up in the portions P1 and P2, and therefore, the top surfaces of the portions P1 and P2 contact the battery pack 206. Accordingly, in the portions P1 and P2, the reference ground conductor 22 without any openings is positioned between the signal line 20 and the battery pack 206. As a result, in the portions P1 and P2, less capacitance is generated between the signal line 20 and the battery pack 206. Moreover, the line portion 12a is tuned bottom side up in the portion P3. Accordingly, in the portion P3, the auxiliary ground conductor 24 without any openings is positioned between the signal line 20 and the battery pack 206. As a result, in the portion P3, less capacitance is generated between the signal line 20 and the battery pack 206. Thus, attaching the flat cable 10d to the battery pack 206 prevents the characteristic impedance of the signal line 20 from being reduced.

Other Preferred Embodiments

The present invention is not limited to the flat cables 10 and 10a to 10d according to the above preferred embodiments, and variations can be made within the spirit and scope of the invention.

Furthermore, the configurations and/or features of the flat cables 10 and 10a to 10d may be used in combination.

The protective layers 14 and 15 have been described above as preferably being formed by screen printing, for example, but they may be formed by photolithography.

The section A3 has been described above as preferably being bent in two places, but it may be bent in three or more places, for example.

The flat cable 10d has been described above as preferably including the three signal lines 20a to 20c, but it may be provided with one signal line 20. In such a case, the distance between the signal line 20 and the reference ground conductor 22 in the z-axis direction is preferably equal or substantially equal to the distance between the signal line 20 and the auxiliary ground conductor 24 in the z-axis direction.

The flat cables 10 and 10a to 10d do not necessarily have the connectors 100a and 100b mounted thereon. In such a case, the flat cables 10 and 10a to 10d are connected at their ends to circuit boards by soldering. Note that each of the flat cables 10 and 10a to 10d may have only the connector 100a mounted on one end.

Through-hole conductors may be used in place of the via-hole conductors. The through-hole conductors are interlayer connecting portions, which are conductors preferably formed by plating inner circumferential surfaces of through-holes provided in the dielectric element assembly 12.

In the flat cables 10 and 10a to 10d, the section A3, which constitutes a portion of the dielectric element assembly 12, defines a zigzag shape, but the entire dielectric element assembly 12 may define a zigzag shape.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A flat cable, comprising:
a dielectric element assembly including a plurality of dielectric layers stacked on each other in a lamination direction; and
a linear signal line provided in the dielectric element assembly; wherein
the dielectric element assembly includes at least one section bent in a plurality of places to define a zigzag section when viewed in a plan view in the direction of lamination;
in the zigzag section of the dielectric element assembly, any portions of the dielectric element assembly that are not adjacent across a bending line do not overlap when viewed in a plan view in the direction of lamination;
the zigzag section of the dielectric element assembly includes a first portion and a third portion where the dielectric element assembly is not turned bottom side up and a second portion where the dielectric assembly is turned bottom side up, the second portion between the first portion and the third portion;
the dielectric element assembly is bent at a boundary between the first portion and the second portion, and at a boundary between the second portion and the third portion; and
when the zigzag section is unfolded on a plane, the second portion is at an obtuse angle to the first portion and to the third portion.
2. The flat cable according to claim 1, further comprising:
a first ground conductor positioned on a first side in the direction of lamination relative to the signal line; and
a second ground conductor positioned on a second side in the direction of lamination relative to the signal line.
3. The flat cable according to claim 2, wherein,
the first ground conductor includes a plurality of openings arranged along the signal line; and
the first ground conductor is less distant from the signal line in the direction of lamination than the second ground conductor from the signal line in the direction of lamination.
4. A flat cable, comprising:
a dielectric element assembly including a plurality of dielectric layers stacked on each other in a lamination direction;
a linear signal line in the dielectric element assembly;
a first ground conductor positioned on a first side in the direction of lamination relative to the signal line; and
a second ground conductor positioned on a second side in the direction of lamination relative to the signal line; wherein
the dielectric element assembly includes at least one section bent in a plurality of places to define a zigzag section when viewed in a plan view in the direction of lamination;
in the zigzag section of the dielectric element assembly, any portions of the dielectric element assembly that are not adjacent across a bending line do not overlap when viewed in the plan view in the direction of lamination;
the first ground conductor includes a plurality of first openings arranged along the signal line in a first portion of the zigzag section of the dielectric element assembly where the dielectric element assembly is not turned bottom side up;
the second ground conductor includes a plurality of second openings arranged along the signal line in a second portion of the zigzag section of the dielectric element assembly where the dielectric element assembly is turned bottom side up,
in the first portion, the first ground conductor is less distant from the signal line in the direction of lamination than the second ground conductor from the signal line in the direction of lamination; and in the second portion, the first ground conductor is more distant from the signal line in the direction of lamination than the second ground conductor from the signal line in the direction of lamination.

5. A flat cable, comprising:
a dielectric element assembly including a plurality of dielectric layers stacked on each other in a lamination direction;
a linear signal line provided in the dielectric element assembly;
a first ground conductor positioned on a first side in the direction of lamination relative to the signal line; and
a second ground conductor positioned on a second side in the direction of lamination relative to the signal line;
inter-layer connecting portions piercing through the dielectric layer and connecting the first ground conductor and the second ground conductor; wherein
the dielectric element assembly includes at least one section bent in a plurality of places to define a zigzag section when viewed in a plan view in the direction of lamination;
in the zigzag section of the dielectric element assembly, any portions of the dielectric element assembly that are not adjacent across a bending line do not overlap when viewed in the plan view in the direction of lamination; and
the inter-layer connecting portions are not disposed at bending lines.

6. The flat cable according to claim 1, wherein the zigzag section of the dielectric element assembly is narrower than another section of the dielectric element assembly that does not define a zigzag shape.

7. The flat cable according to claim 1, wherein the dielectric element assembly is flexible.

8. The flat cable according to claim 1, wherein the linear signal line includes a plurality of signal lines.

9. The flat cable according to claim 5, wherein the inter-layer connecting portions include one of via-hole conductors and through-hole conductors.

10. An electronic device comprising the flat cable according to claim 1.

11. The flat cable according to claim 4, further comprising inter-layer connecting portions piercing through the dielectric layer and connecting the first ground conductor and the second ground conductor; wherein
the inter-layer connecting portions are not disposed at bending lines.

12. The flat cable according to claim 4, wherein the dielectric element assembly is flexible.

13. The flat cable according to claim 4, wherein the linear signal line includes a plurality of signal lines.

14. The flat cable according to claim 11, wherein the inter-layer connecting portions include one of via-hole conductors and through-hole conductors.

15. An electronic device comprising the flat cable according to claim 4.

16. The flat cable according to claim 5, wherein
the first ground conductor includes a plurality of openings arranged along the signal line; and
the first ground conductor is less distant from the signal line in the direction of lamination than the second ground conductor from the signal line in the lamination direction.

17. The flat cable according to claim 5, wherein the dielectric element assembly is flexible.

18. The flat cable according to claim 5, wherein the linear signal line includes a plurality of signal lines.

19. The flat cable according to claim 5, wherein the inter-layer connecting portions include one of via-hole conductors and through-hole conductors.

20. An electronic device comprising the flat cable according to claim 5.

* * * * *